(12) United States Patent  (10) Patent No.: US 8,378,687 B2
Yoneda et al.  (45) Date of Patent:  Feb. 19, 2013

(54) METHOD OF MEASURING CHARACTERISTICS REGARDING SAFETY OF BATTERY

(75) Inventors: Yasuhiro Yoneda, Kawasaki (JP);
Katsusada Motoyoshi, Kawasaki (JP);
Yukiko Wakino, Kawasaki (JP);
Kensuke Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 751 days.

(21) Appl. No.: 12/247,449

(22) Filed: Oct. 8, 2008

(65) Prior Publication Data

US 2009/0096459 A1  Apr. 16, 2009

(30) Foreign Application Priority Data

Oct. 12, 2007  (JP) ................. 2007-266844

(51) Int. Cl.
*G01N 27/416*  (2006.01)
(52) U.S. Cl. ....................................... 324/430
(58) Field of Classification Search .................. 320/132; 324/425–436; 429/231.95, 223, 224
See application file for complete search history.

(56) References Cited

U.S. PATENT DOCUMENTS

| | | | | |
|---|---|---|---|---|
| 6,160,382 | A * | 12/2000 | Yoon et al. ..................... | 320/136 |
| 6,208,147 | B1 | 3/2001 | Yoon et al. | |
| 6,262,577 | B1 | 7/2001 | Nakao et al. | |
| 2005/0233220 | A1* | 10/2005 | Gozdz et al. ............. | 429/231.95 |
| 2006/0170397 | A1* | 8/2006 | Srinivasan et al. ............ | 320/132 |
| 2007/0257681 | A1* | 11/2007 | Christophersen et al. .... | 324/426 |

FOREIGN PATENT DOCUMENTS

| | | | |
|---|---|---|---|
| JP | 10-232273 | A | 9/1998 |
| JP | 2000-9817 | A | 1/2000 |
| JP | 2000-100478 | A | 4/2000 |
| JP | 2000-156248 | A | 6/2000 |
| JP | 2001-351696 | A | 12/2001 |
| JP | 2003-157912 | A | 5/2003 |
| JP | 2004-071303 | A | 3/2004 |
| JP | 2007-265894 | A | 10/2007 |

OTHER PUBLICATIONS

Equivalent Circuit Modeling Using the Gamry EIS300 Electrochemical Impedance Spectroscopy Software, 2003, available at http://gamry.com/App_Notes/EIS_Modeling/EIS_Modeling.pdf.*
Botte et al., Modeling Lithium Intercalation in a Porous Carbon Electrode, Journal of The Electrochemical Society, 148 (1) A54-A66, 2001.*
Laman et al., Inductive impedance of a spirally wound Li/MoS2 cell, J. Electrochem. Soc., 133, 2441, 1986.*
Japanese Office Action dated Sep. 27, 2011, issued in corresponding Japanese Patent Application No. 2007-266844.

* cited by examiner

*Primary Examiner* — Melissa Koval
*Assistant Examiner* — Daniel Miller
(74) *Attorney, Agent, or Firm* — Westerman, Hattori, Daniels & Adrian, LLP

(57) ABSTRACT

A measuring method of a battery includes the step of measuring frequency characteristics of an internal impedance of the battery by an AC impedance method, and determining a parameter of an element representing ease of mobility of charges on a surface of a positive electrode of the battery and that of an element representing the ease of mobility of charges on the surface of a negative electrode.

12 Claims, 18 Drawing Sheets

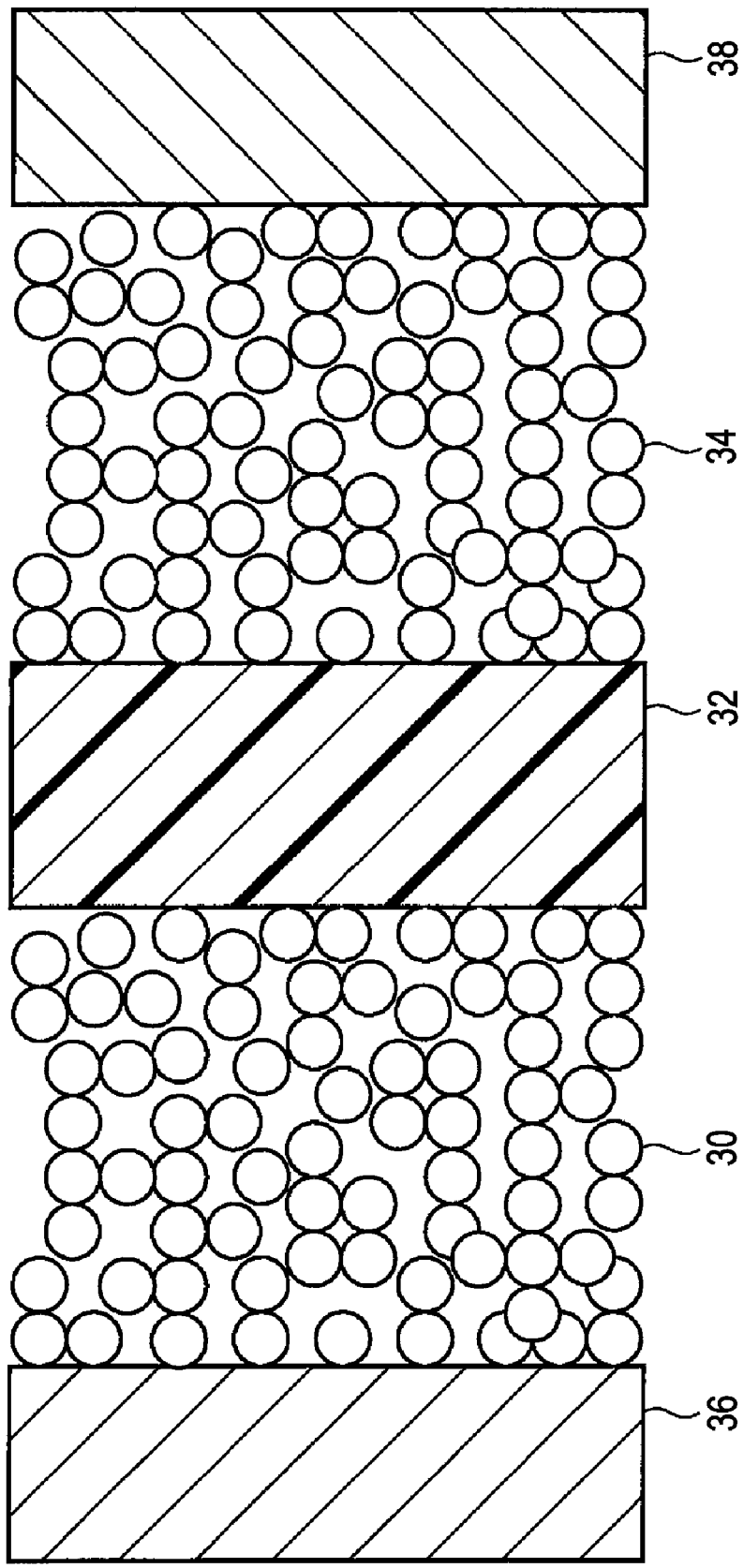

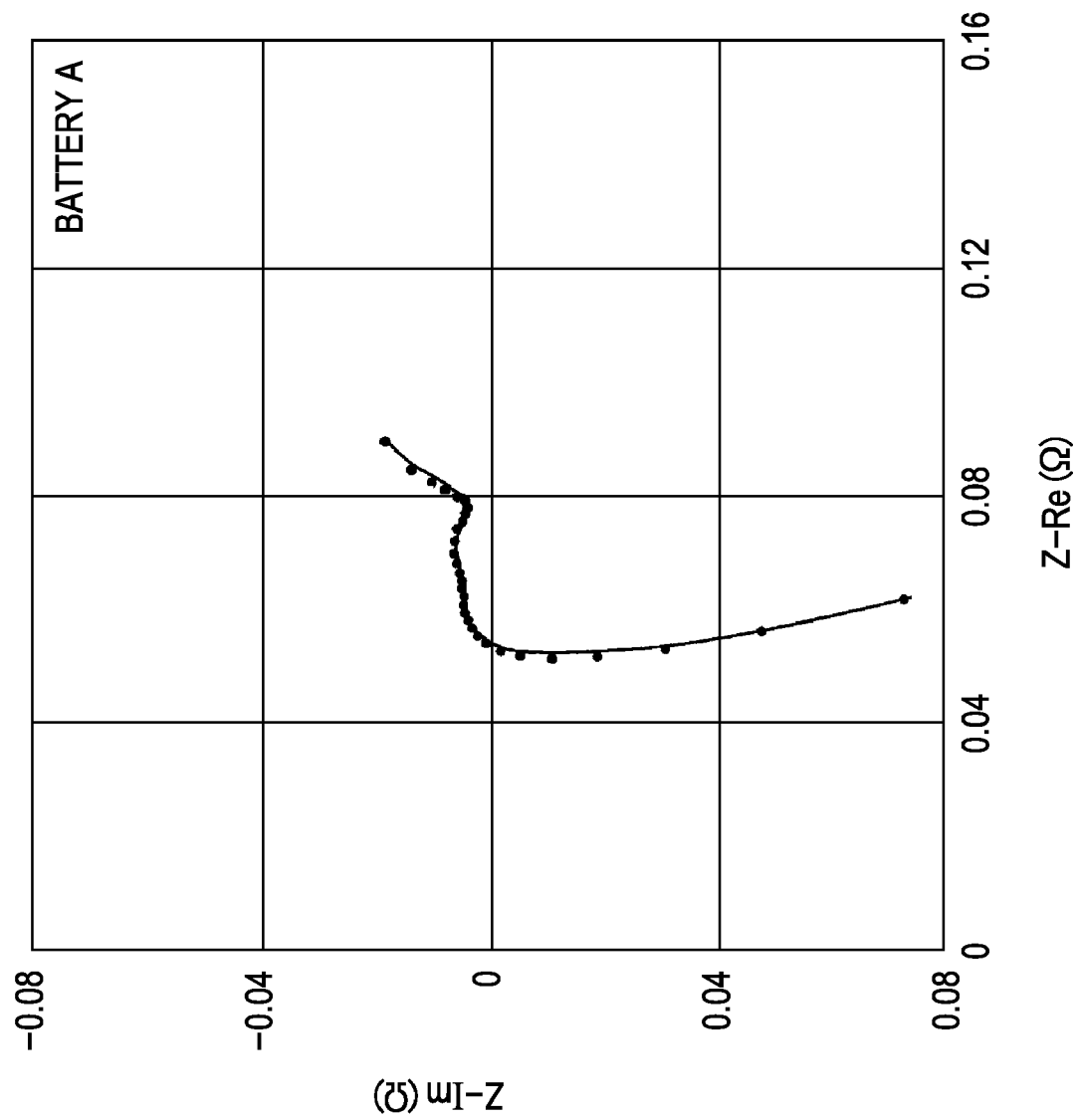

METHOD OF MEASURING CHARACTERISTICS REGARDING SAFETY OF BATTERY

CROSS-REFERENCE TO RELATED APPLICATIONS

This application is based upon and claims the benefit of priority from the prior Japanese Patent Application No. 2007-266844, filed on Oct. 12, 2007 the entire contents of which are incorporated herein by reference.

TECHNICAL FIELD

The present invention relates to a method of measuring characteristics regarding safety of batteries by the AC impedance method and a method of manufacturing batteries using the measuring method.

BACKGROUND

Compared with other secondary batteries such as nickel-cadmium batteries and nickel hydrogen batteries, lithium ion batteries have excellent characteristics such as a higher energy density, no memory effect, and a longer cycle life. For these reasons, lithium ion batteries have been widely used as a power source of portable electronic devices.

In the past few years, on the other hand, defects such as smoking or firing of battery packs using lithium ion batteries have arisen. The cause is considered to be a short circuit between electrodes due to mixed foreign metallic particles inside such lithium ion batteries. Currently, however, no foreign metallic particles have been found in batteries in which such defects have arisen and characteristics of batteries themselves could have caused such defects.

A battery capacity measuring method using impedance spectrum analysis is known as an example of a technology to measure such battery characteristics. Also, for example, the characteristic factor digitization method of batteries using a nonlinear equivalent circuit model is known.

However, the above technologies are both used to determine a battery capacity and are not methods of determining characteristics regarding safety of batteries.

Knowing electrical characteristics regarding safety of batteries is considered to be extremely important also for preventing defects caused by batteries. Moreover, if good batteries can be distinguished from bad ones by a simple method, defects may be considered to be preventable.

However, no method has been known to evaluate characteristics regarding safety of not only lithium ion batteries, but also other types of batteries. Thus, a simple evaluation method that can distinguish good batteries from bad ones is desired.

Under the current circumstances, as described above, there is a problem that it is difficult to evaluate characteristics regarding safety of batteries by a simple method to distinguish good batteries from bad ones.

SUMMARY

According to one aspect of the present invention, a measuring method of a battery includes the step of measuring frequency characteristics of an internal impedance of the battery by an AC impedance method, and determining a parameter of an element representing the ease of mobility of charges on a surface of a positive electrode of the battery and that of an element representing the ease of mobility of charges on the surface of a negative electrode.

BRIEF DESCRIPTION OF THE DRAWINGS

FIG. 4 is a schematic diagram showing a structure of the lithium ion battery.

FIG. 7 is a graph (part 1) representing measured data and calculated data of an internal impedance of the lithium ion battery as a complex plane diagram.

DETAILED DESCRIPTION OF THE EMBODIMENTS

Embodiments of the present invention will be described below with reference to FIG. 1 to FIGS. 18A and 18B.

[First Embodiment]

First, frequency characteristics of an internal impedance of a lithium ion battery to be analyzed are measured by the AC impedance method. The AC impedance method is a method by which an electrochemical parameter (electrochemical impedance) of a measurement target is obtained from AC response characteristics thereof after applying a voltage in which micro AC voltage is superimposed on a DC voltage to the measurement target. The AC impedance method is characterized in that frequency characteristics of impedance can be measured without changing the state of a measurement target because the AC voltage to be applied is small.

Figure 1:
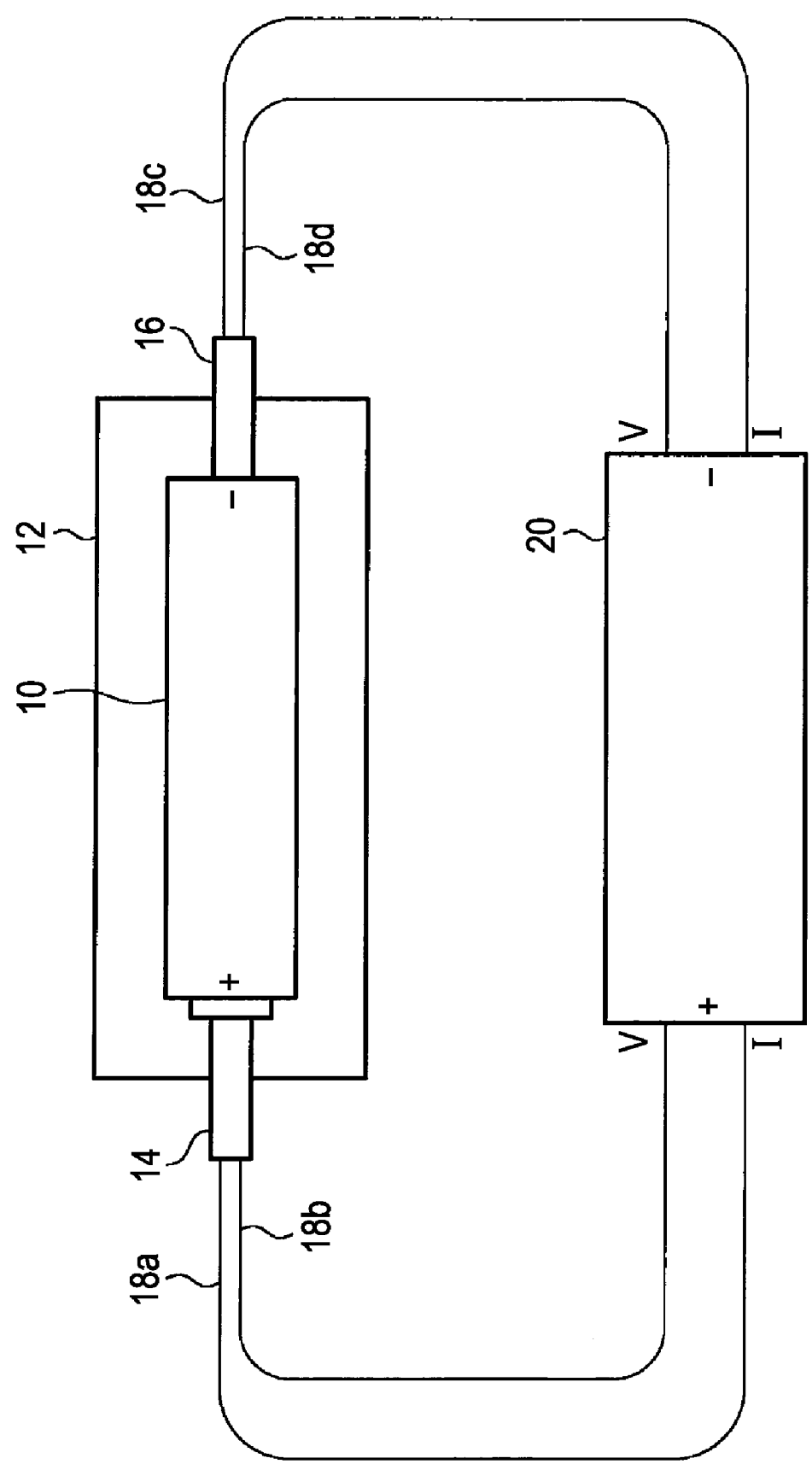
FIG. 1 is a schematic diagram showing a circuit used for a measuring method of a lithium ion battery according to a first embodiment.

FIG. 1 is a diagram exemplifying a method of measuring an internal impedance of a battery according to the first embodiment. More specifically, a case in which a lithium ion battery is used as a battery will be exemplified.

As shown in FIG. 1, a lithium ion battery 10 is mounted on a support 12 for measurement. An anode (+) of the lithium ion battery 10 is electrically connected to an anode-side terminal 14 of the support 12. Also, a cathode (−) of the lithium ion battery 10 is electrically connected to a cathode-side terminal 16 of the support 12.

Two measuring cables 18a and 18b are connected to the anode-side terminal 14. Also, two measuring cables 18c and 18d are connected to the cathode-side terminal 16. Other ends of the measuring cables 18a, 18b, 18c and 18d are connected to a measuring apparatus 20. The measuring apparatus 20 is an electrochemical characteristic measuring apparatus capable of measuring impedance by the AC impedance method. An electrochemical measuring system (SI 1280B) manufactured by Solartron, for example, may be used as the measuring apparatus 20.

The measuring cables 18a and 18c are cables for measuring a current passing through the lithium ion battery 10. The measuring cables 18b and 18d are cables for applying a measuring voltage to the lithium ion battery 10 and also for measuring the voltage between both ends of the lithium ion battery 10.

With the apparatus configuration described above, an internal impedance of the lithium ion battery 10 can be measured based on the principle of the AC four-terminal method.

The voltage (measuring voltage) applied to the lithium ion battery 10 from the measuring cables 18b and 18d is a voltage obtained by superimposing an AC voltage component on a DC voltage component. The DC voltage component is desirably set to about a voltage of the lithium ion battery 10 to be measured. The AC voltage component to be superimposed is desirably set to a voltage that does not affect characteristics of the lithium ion battery 10, for example, to about 10 mV.

For measurement by the AC impedance method, frequencies of the AC voltage are swept from high frequencies to low frequencies to measure, at predetermined frequency intervals, an internal impedance of the lithium ion battery 10 at each frequency.

Frequency characteristics of the measured internal impedance can be represented as a complex plane diagram (Cole-Cole plot) with the real axis set for a resistance component and the imaginary axis for a reactance component. The reactance component shows a capacitive component. If measuring frequencies are changed from high frequencies to low frequencies, an impedance locus describing a clockwise semicircle is obtained. The impedance of the measurement target can be analyzed from an intercept of the locus, an RC time constant at the vertex of the semicircle, and the like.

Figure 2:
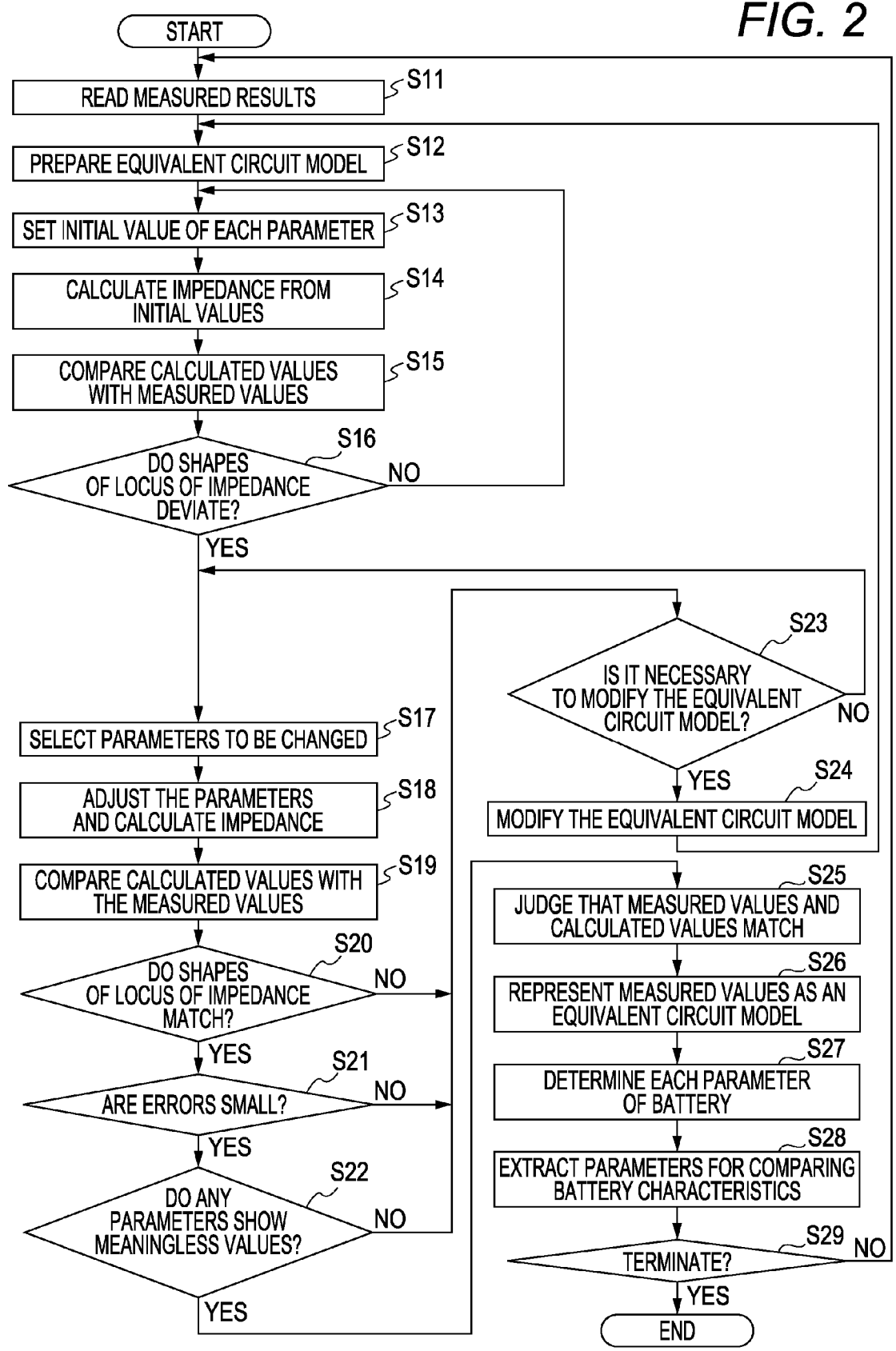
FIG. 2 is a flow chart showing the measuring method of the lithium ion battery according to the first embodiment.

Next, the lithium ion battery is analyzed by the procedure shown in FIG. 2 using results obtained by the measurement shown in FIG. 1, that is, measured data of frequency characteristics of the internal impedance of the lithium ion battery. All steps shown in FIG. 2 may automatically be performed by a computer, or part thereof may manually be performed by an operator. Each step in FIG. 2 will be described below in detail.

First, measurement results of the internal impedance of the lithium ion battery to be analyzed are read into a computer by an analysis program (step S11).

Next, an equivalent circuit model (impedance model) describing an internal impedance of the lithium ion battery to be analyzed is produced in consideration of the structure of the lithium ion battery 10 and an electrochemical electrode model (step S12). The present step includes a step of inputting the equivalent circuit model into the computer.

Step S12 need not be performed each time. The equivalent circuit model does not change significantly depending on the type of lithium ion battery and is normally considered to be determined. If the equivalent circuit model is determined, step S11 proceeds to step S13.

Figure 3:
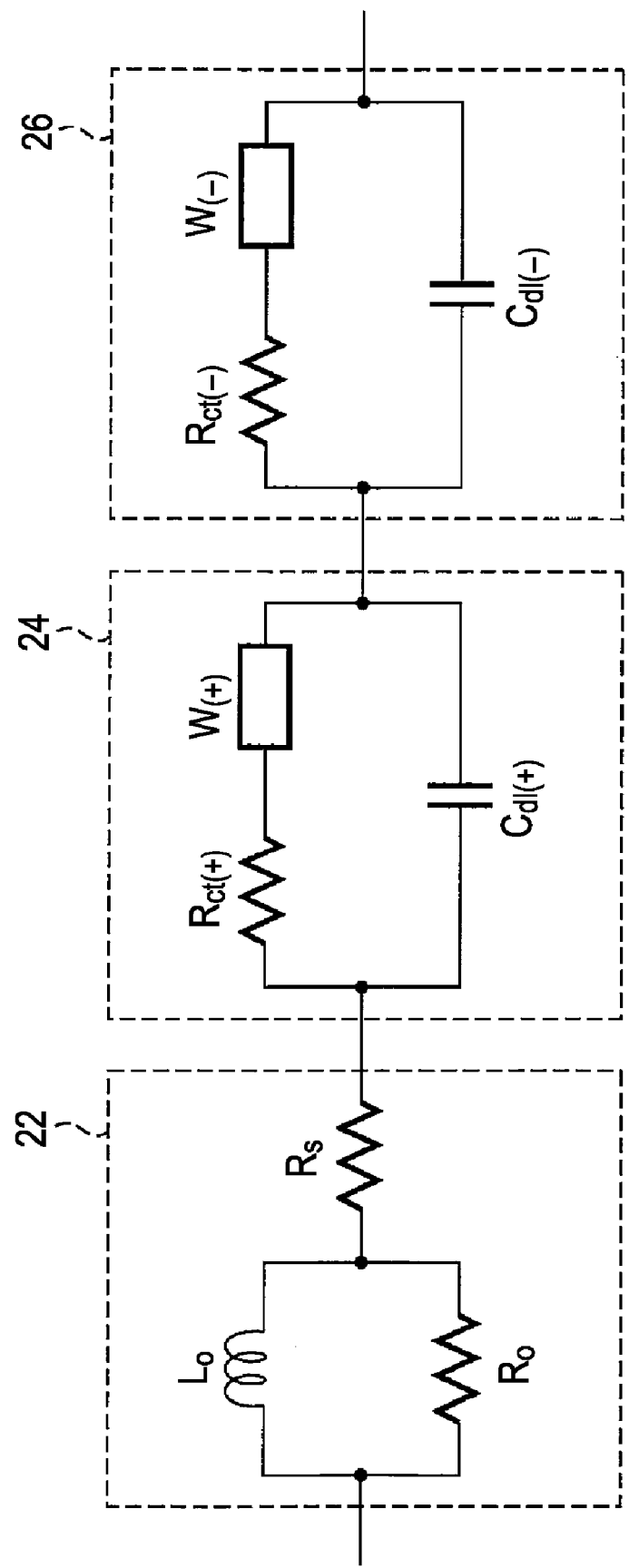
FIG. 3 is a circuit diagram showing an equivalent circuit model of the lithium ion battery used for the measuring method of the lithium ion battery according to the first embodiment.

The equivalent circuit shown in FIG. 3, for example, can be used as an equivalent circuit model to describe the internal impedance of the lithium ion battery.

A circuit 22 in FIG. 3 is an impedance component based on the structure of the lithium ion battery 10 and circuits 24 and 26 are impedance components based on an electric model considering an electrochemical reaction in the electrode.

The lithium ion battery 10 has, as shown for example in FIG. 4, a positive electrode 30 and a negative electrode 34 arranged opposite to each other via a separator 32. The positive electrode 30 may be, for example, a lithium metal such as lithium cobalt oxide ($LiCoO_2$) soaked in an electrolyte, and the negative electrode 34 may be, for example, carbon (C) soaked in an electrolyte. An organic solvent such as ethylene carbonate and diethyl carbonate in which lithium salt such as lithium borate tetrafluoride ($LiBF_4$) is dissolved may be used as an electrolyte. Also, as shown in FIG. 4, the positive electrode 30 is connected to a collector 36 (the collector 36 is connected to the anode (+)) made of, for example, aluminum (Al), and the negative electrode 34 is connected to a collector 38 (the collector 38 is connected to the cathode (−)) made of, for example, copper (Cu). The positive electrode 30 and the negative electrode 34 are sealed in a container (not shown) in a wound state after being processed into strips.

In the circuit 22, a resistance Ro and an inductor Lo, which are connected in parallel, and a resistance Rs are connected in series. Here, the resistance Rs represents resistance of the whole cell (the electrolyte, the positive electrode 30, the negative electrode 34, the collectors 36 and 38, and the like) at high frequencies. The resistance Ro represents ohmic resistance of the positive electrode 30 and the negative electrode 34. The inductor Lo represents an inductance component resulting from a structure in which a thin electrode is wound. That is, the resistance Ro and the inductor Lo represent impedance components resulting from the structure of a battery, and the resistance Rs represents a series resistance component between two terminals of a battery by an electrolyte, electrode, and the like. However, components in an equivalent circuit model are empirically combined to fit to measured data and thus it is difficult to definitely isolate the physical meaning of each component.

The circuits 24 and 26 are electrochemical impedance models (hereinafter, referred to as "electrode models") in consideration of an electrochemical reaction in the positive electrode 30 and the negative electrode 34 respectively. The electrode models are described, for example, in "5th Edition, Experimental Chemistry Course 25, Catalytic Chemistry, Electrochemistry" published by Maruzen Co., Ltd. in detail.

The lithium ion battery 10 has two electrodes of the positive electrode 30 and the negative electrode 34 and thus, the equivalent circuit model contains the circuit 24 corresponding to the electrode model of the positive electrode 30, and the circuit 26 corresponding to that of the negative electrode 34. In the circuit 24, a serially connected body consisting of a resistance Rct (+) and an impedance W (+) is connected in parallel to a capacitor Cdl (+). Similarly, in the circuit 26, a serially connected body consisting of a resistance Rct (−) and an impedance W (−) is connected in parallel to a capacitor Cdl (−). The resistance Rct (+) and the resistance Rct (−) are resistance components called charge transfer resistance. The impedance W (+) and the impedance W (−) are impedance components called diffusion impedance (also called a Warburg impedance). The capacitor Cdl (+) and the capacitor Cdl (−) are capacitance components called an electric double layer capacity.

Figure 5A:
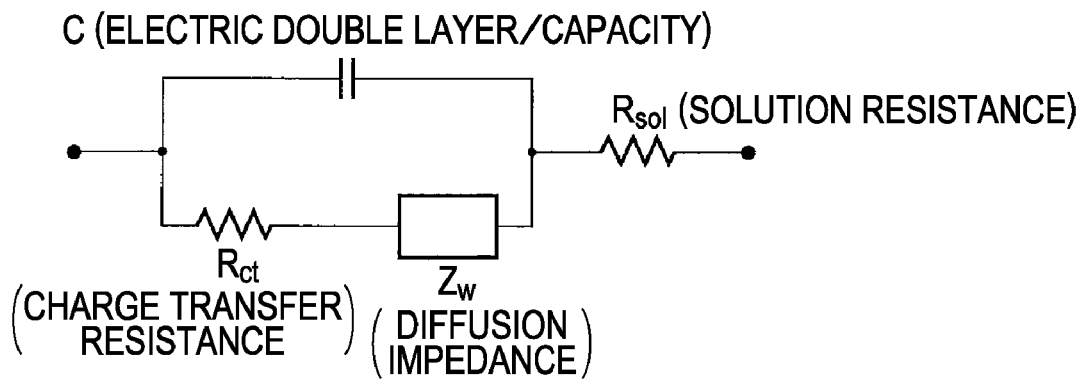
FIGS. 5A and 5B are an equivalent circuit and a complex plane diagram illustrating an electrochemical electrode model.

An electrode model is generally represented by an equivalent circuit as shown in FIG. 5A. In FIG. 5A, a resistance Rct represents charge transfer resistance, an impedance ZW represents diffusion impedance, a capacitor C represents an electric double layer capacity, and a resistance Rsol represents solution resistance of an electrolyte. The resistance Rct, the impedance ZW, and the capacitor C correspond to the resistance Rct (+) or the resistance Rct (−), the impedance W (+) or the impedance W (−), and the capacitor Cdl (+) or the capacitor Cdl (−) of the circuits 24 and 26 respectively. The resistance Rsol corresponds to a portion of the resistance component of the resistance Rs in the circuit 22.

Figure 5B:
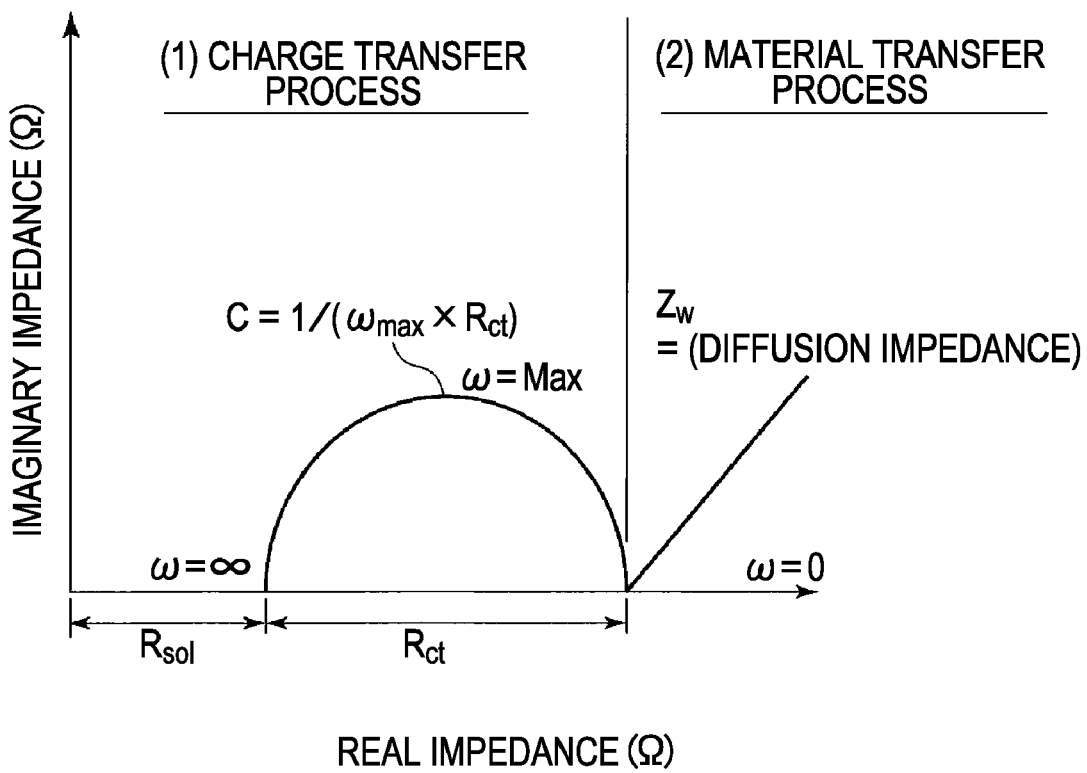

FIG. 5B shows frequency characteristics of the impedance of the equivalent circuit in FIG. 5A as a complex plane diagram (Cole-Cole plot). If an angular frequency ω of an AC voltage is scanned from a high frequency side to a low frequency side, an impedance locus describing a clockwise semicircle is obtained. This process is called a charge transfer process. If the frequency is further decreased, an impedance locus increasing in the direction of 45 degrees with respect to the real axis and the complex axis is obtained. This process is called a material transfer process.

In the Cole-Cole plot, the distance from the origin to the semicircle along the real axis corresponds to the resistance Rsol. The diameter of the semicircle corresponds to the resistance Rct. The impedance in the material transfer process corresponds to the impedance ZW. If the angular frequency ω that makes the reactance value in the semicircle maximum is ωmax, then $1/(\omega max \times Rct)$ corresponds to the capacitor C. Therefore, the charge transfer resistance Rct, the diffusion impedance ZW, the electric double layer capacity C, and the solution resistance Rsol can be calculated by obtaining a Cole-Cole plot.

If frequency characteristics of an internal impedance of a lithium ion battery are measured by the AC impedance method, two electrodes of the positive electrode 30 and the negative electrode 34 are present in the battery and thus, a locus of two overlapped semicircles is plotted as a Cole-Cole plot.

If an inductance component appears in measured data of the internal impedance of the lithium ion battery, an inductor is added to the equivalent circuit model. This is because inductance is in a phase opposite to that of capacitance and affects the size of reactance and the phase of impedance. A correct result cannot be obtained only by analyzing capacitance while ignoring inductance. Whether or not an inductance component appears in measured data of the internal impedance is determined by whether or not a region showing positive reactance (the imaginary part is a positive value) is present in the Cole-Cole plot.

Next, optimal values of parameters of components constituting the equivalent circuit model are determined so that measured data of the lithium ion battery, that is, frequency characteristics (measured data) of the internal impedance in the lithium ion battery match frequency characteristics (calculation results) of impedance calculated based on the equivalent circuit model prepared at step S12.

The optimal value of each parameter is determined by adjusting each parameter so that measured data and calculation results match. More specifically, first an equivalent circuit model and initial values of parameters are input into a simulator to determine a Cole-Cole plot or a Bode diagram by calculation. Next, each parameter is adjusted so that the determined Cole-Cole plot or Bode diagram matches measured data. In this manner, the optimal value of each parameter is determined.

In addition, the inventors used AC impedance measurement/analysis software attached to the electrochemical measuring system (SI 1280B) manufactured by Solartron as the simulator. This software can perform calculations to fit each parameter to measured data after inputting the equivalent circuit model and initial values of parameters.

More specifically, optimal values of parameters of components constituting the equivalent circuit model are determined following the procedure below.

First, initial values of parameters of the equivalent circuit model are set (step S13).

A Cole-Cole plot obtained from measured data of the internal impedance of the lithium ion battery represents, as described above, overlapped characteristics of two electrodes. Further, the Cole-Cole plot contains an inductance component. Thus, it is difficult to obtain correct resistance Rct, capacitor C, and diffusion impedance ZW values from such a Cole-Cole plot (obtained from measured data) through general semicircle analysis. The only parameter that can be read from an impedance locus is the resistance Rs. Initial values of these parameters are set by referring to the size of the impedance locus.

If the same type of lithium ion battery has been measured in the past, values determined at that time can be used as initial values.

When setting initial values of parameters, it is desirable not to set an extremely large or small value as an initial value.

Providing the same initial values to components constituting the circuits 24 and 26 makes the use of an equivalent circuit having one electrode model essentially equivalent, and makes fitting to measured data more difficult. Thus, in the measuring method of a lithium ion battery according to the present embodiment, initial values of parameters related to diffusion on the negative electrode side are set to be larger than those of parameters related to diffusion on the positive electrode side to distinguish the positive electrode and the negative electrode.

This is due to the fact that when a lithium ion battery is charged, more lithium ions are concentrated on the negative electrode side. That is, while being charged, there is less space between layers of the negative electrode into which lithium ions can be inserted. In other words, there is less space where lithium ions can move and the lithium ions cannot move very easily. Thus, the diffusion coefficient of lithium ions on the negative electrode side is considered to be small.

Generally, measurement of a lithium ion battery is preferably performed while charged. This is because if a lithium ion battery is measured while charged, fluctuations in measurement results can be minimized. The above assumption takes such measurement circumstances into consideration.

More specifically, parameters related to diffusion are the diffusion impedance W (+) and the diffusion impedance W (−). It is known that the diffusion impedance W is generally expressed as W=(Rd×tan h (jω((δ^2)/D)) ^½)/((jω((δ^2)/D))^½), where Rd is the diffusion resistance, ω is the angular frequency, δ is the diffusion distance, and D is the diffusion coefficient.

In the analysis program used by the inventors, the diffusion impedance W is rewritten to W=(R×tan h (jωT)^P)/((jωT)^P) to calculate variables P, R, and T as parameters. Among these variables, the parameter related to diffusion is the variable T.

Thus, in the measuring method of a lithium ion battery according to the present invention, the initial value of the variable T of the diffusion impedance W (−) and that of the variable T of the diffusion impedance W (+) are made different to distinguish between the positive electrode and the negative electrode. The variable T is represented as T=(δ^2)/D. If the diffusion distance δ is assumed to take an equal value for the positive electrode and the negative electrode, the value of the variable T increases with a decreasing diffusion coefficient D. That is, by setting the initial value of the variable T of the diffusion impedance W (−) to be a larger value than that of the variable T of the diffusion impedance W (+), parameters can be weighted suitably in accordance with actual measuring situations.

Figure 9:
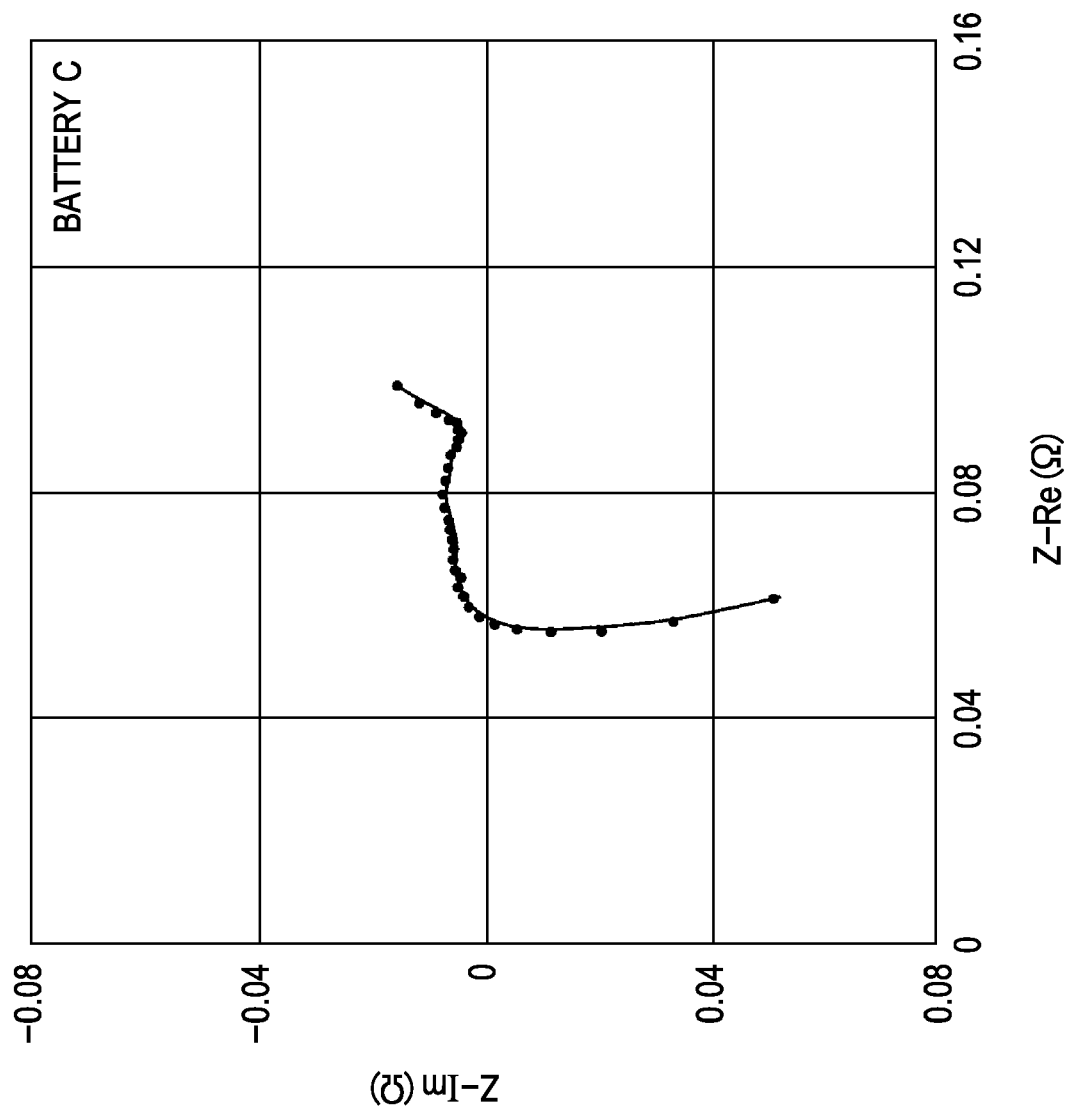
FIG. 9 is a graph (part 3) representing measured data and calculated data of the internal impedance of the lithium ion battery as a complex plane diagram.
Figure 10:
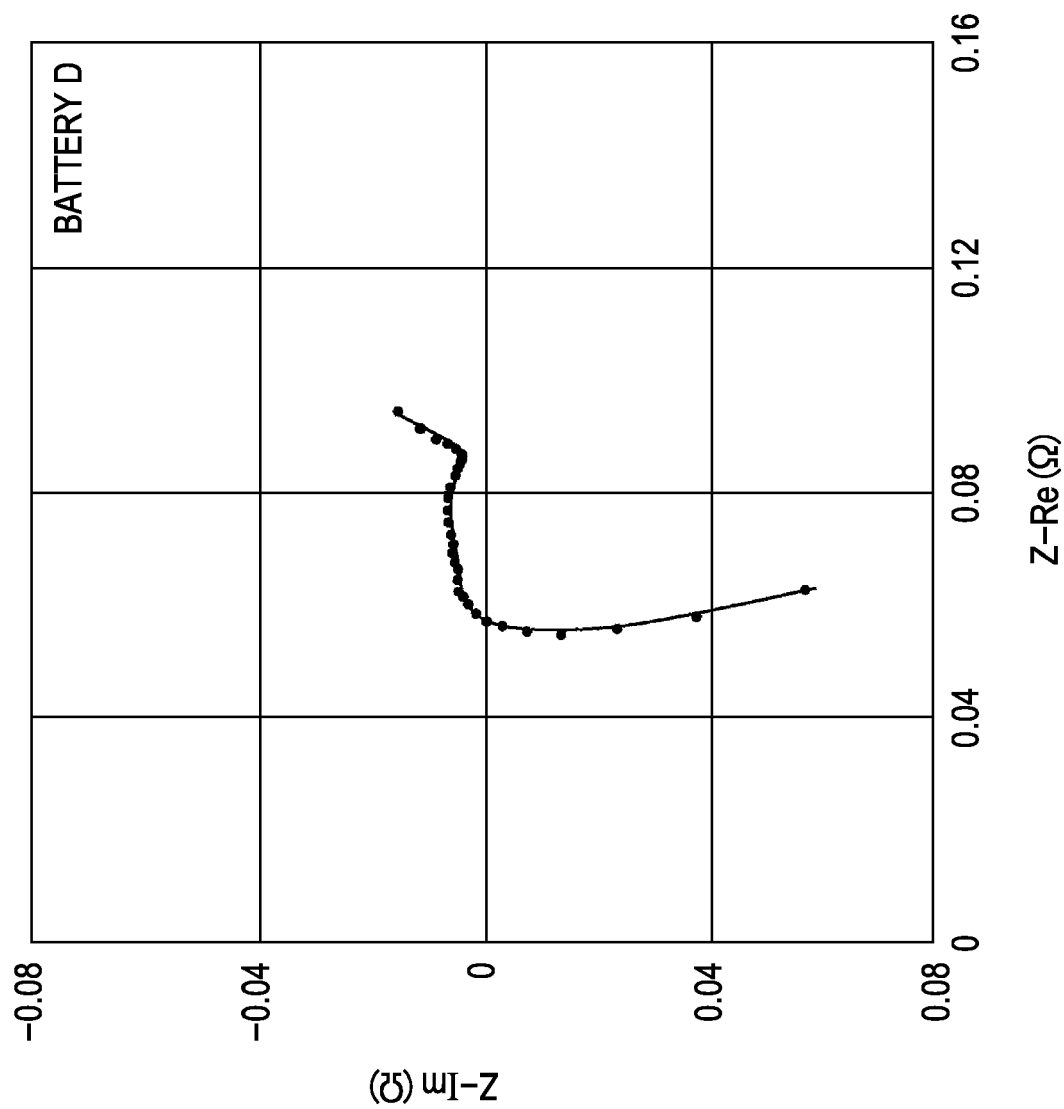
FIG. 10 is a graph (part 4) representing measured data and calculated data of the internal impedance of the lithium ion battery as a complex plane diagram.
Figure 11:
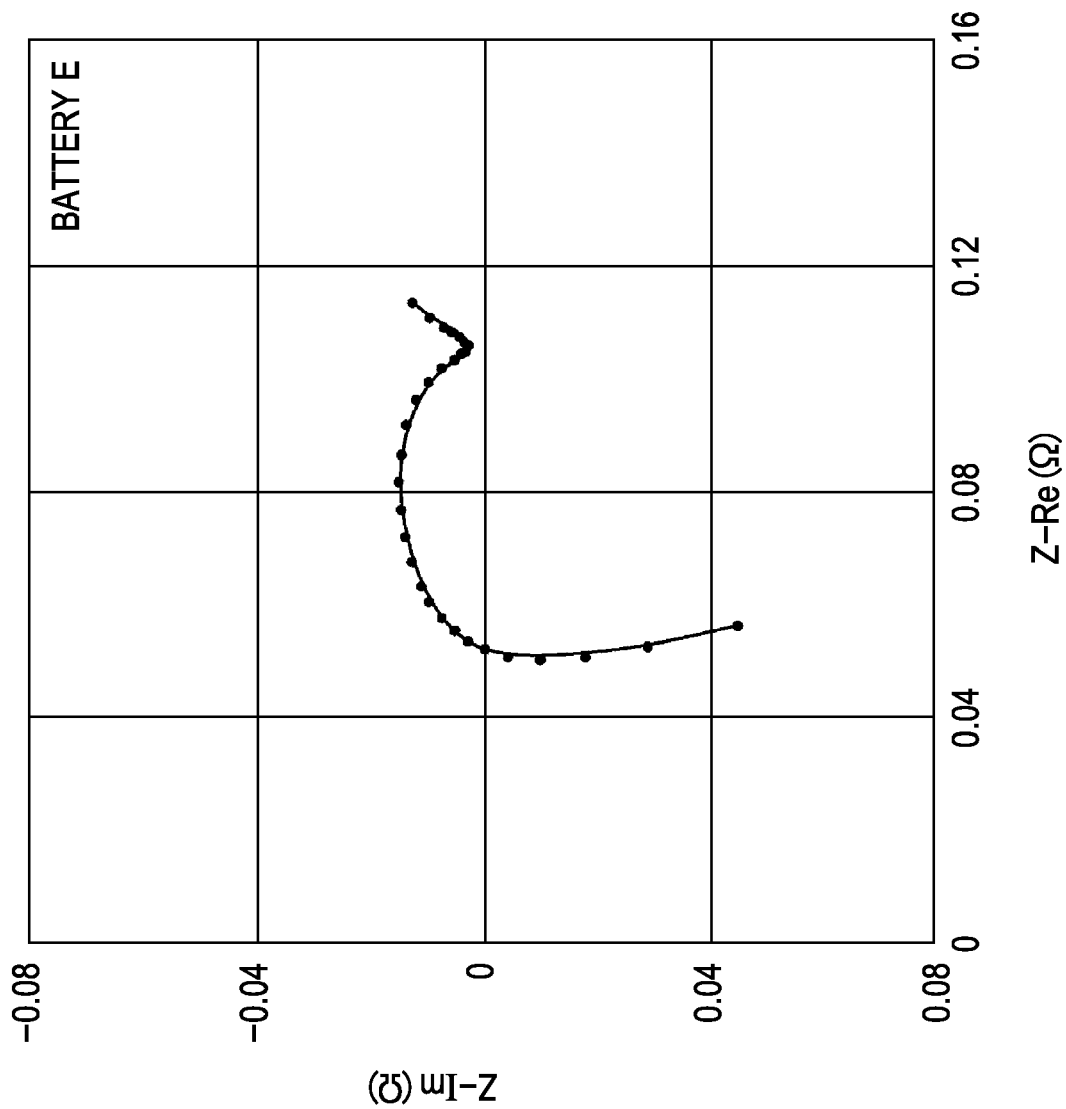
FIG. 11 is a graph (part 5) representing measured data and calculated data of the internal impedance of the lithium ion battery as a complex plane diagram.
Figure 12:
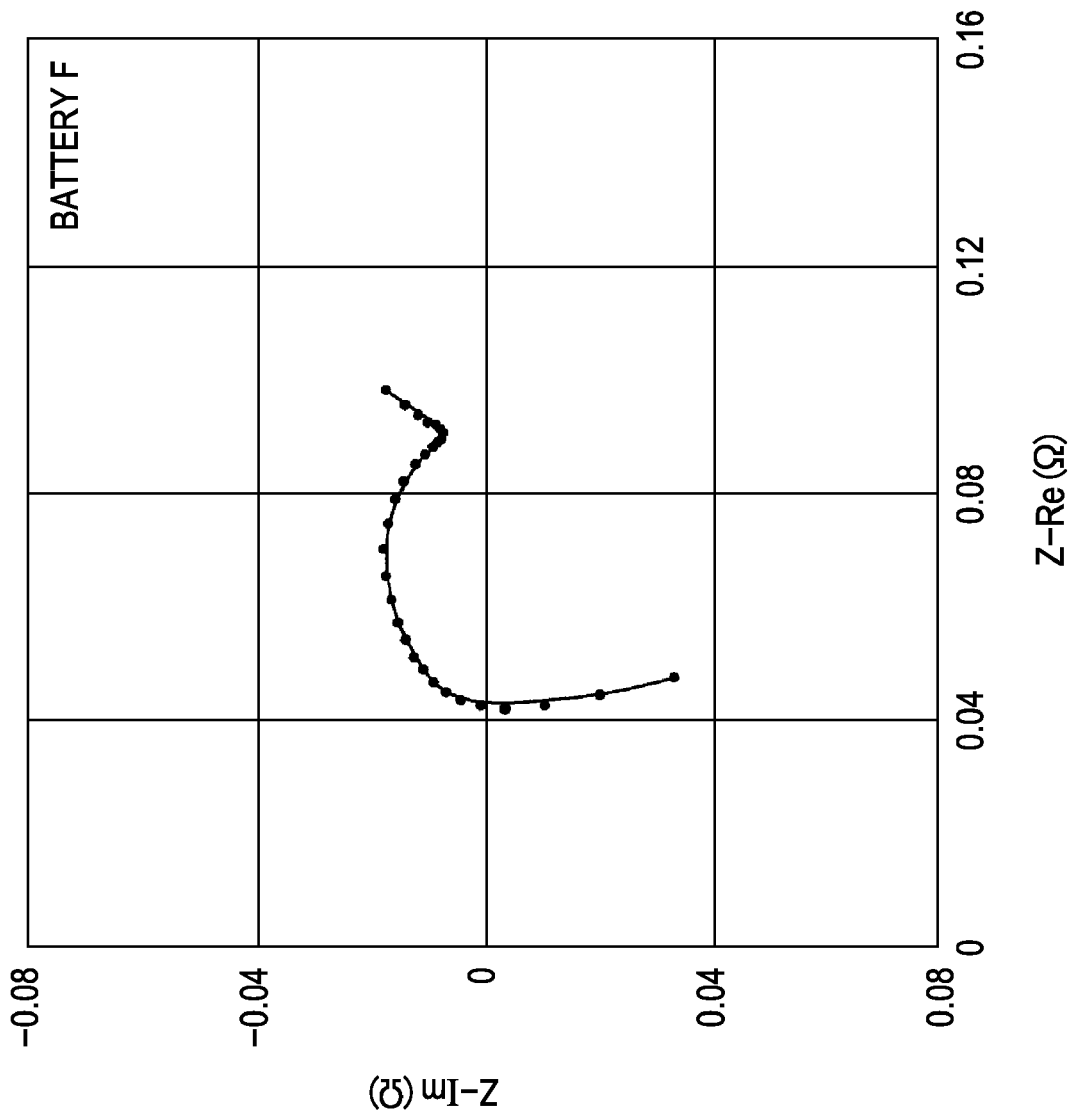
FIG. 12 is a graph (part 6) representing measured data and calculated data of the internal impedance of the lithium ion battery as a complex plane diagram.

The following values in (1) to (7) can be used as initial values of parameters, for example, for a battery C described later (See FIG. 9).

(1) Apply a value (for example, =0.055) at an intersection point of the impedance locus and the real axis as the value of the resistance Rs.

(2) Apply an arbitrary value (for example, 10−6) as the value of the inductor Lo.

(3) Apply an arbitrary value (for example, 1) as the value of the resistance Ro.

(4) Apply a value (for example, 0.015) about half the diameter of a semicircle considered to represent two semicircles as the value of the resistance Rct.

(5) Apply an arbitrary value (for example, 1) as the value of the capacitor Cdl and apply an arbitrary value (for example, 0.01) as the value of the variable R.

(6) Apply a value (for example, 1 for the positive electrode and 100 for the negative electrode) weighted by considering that lithium ions are concentrated on the cathode side as the value of the variable T.

(7) Apply an arbitrary value (for example, 0.5) as the value of the variable P.

To eliminate uncertainties other than an uneven distribution of ions, it is preferable to set electrode parameters other than the variable T to be equal values on the positive electrode side and the negative electrode side. Moreover, the variable T is preferably set to be weighted, for example, with a ratio of positive electrode side 10 the negative electrode side 100 or greater.

Next, using the initial value of each set parameter, frequency characteristics of impedance of the equivalent circuit model are calculated (step S14).

Next, frequency characteristics of impedance calculated from the equivalent circuit model and measured data of the internal impedance of the lithium ion battery are compared (step S15) to determine whether or not the impedance locus of calculated data deviates from that of the measured data (step S16). If, as a result of determination, measured values and calculated values deviate, the initial value of each parameter is reset after returning to step S13. If measured values and calculated values are of equal magnitude, fitting parameters to the measured data is started.

Measured values and calculated values are considered to deviate when, for example, a calculated impedance locus of a Cole-Cole plot extends beyond the display range of the measured values.

Next, among set initial values, parameters whose values should be fixed and those whose values should be changed are selected (step S17). Empirically, measured values and calculated values tend to match faster if the variable P is fixed initially while other parameters are fitted to measured data.

Next, using parameters whose initial values have been changed, frequency characteristics of impedance of the equivalent circuit model are calculated (step S18).

Next, frequency characteristics of impedance calculated from the equivalent circuit model and measured data of the internal impedance of the lithium ion battery are compared (step S19).

When comparing measured values and calculated values, whether or not calculated impedance values and the shape of a locus of measured values match (step S20), whether or not errors between measured values and calculated values are small (step S21), and whether or not any parameters show meaningless values (step S22) are determined.

If processing at steps S20 to S22 is automatically performed, how different the impedance and phase are between measured values and calculated values at each measuring frequency can be selected as criteria for determination. For the impedance, for example, whether or not the calculated value falls within the range of the measured value ±0.001Ω, or whether or not the measured value falls within the range of the calculated value ±0.001Ω for both the real part and imaginary part may be selected as criteria for determination. For the phase, whether or not the calculated value falls within the range of the measured value ±0.5 deg, or whether or not the measured value falls within the range of the calculated value ±0.5 deg may be selected as criteria for determination.

Whether or not a parameter is meaningless (that is, whether or not a parameter is needed for the equivalent circuit model) can be determined by checking whether or not the parameter affects the impedance locus. Consider, for example, a parallel circuit comprising R and C. To determine whether or not the parallel circuit is needed for an equivalent circuit model, for example, whether or not the impedance locus is affected by values of R and Zc (Zc is an impedance of the capacitor C) may be checked as shown below. If, for example, R>>Zc, the parallel circuit has characteristics close to those of a circuit consisting of only C. If, for example, R<<Zc, the parallel circuit has characteristics close to those of a circuit consisting of only R. Accordingly, depending on the combination of parameters R and Zc, a locus of semicircle may not be drawn or the size and phase of impedance may hardly change and thus, in such cases, the RC parallel circuit can be judged to be unnecessary.

Moreover, a circuit in which a plurality of R's is connected in series, a circuit in which a plurality of C's is connected in series, and a circuit in which single elements are connected in series can perform simple impedance composition and therefore, these circuits can be considered to be meaningless when fitting elements to an impedance locus.

Instead of determining whether or not an element is meaningless for fitting to the impedance locus, it is possible to set all elements in the equivalent circuit model to have a meaning for processing. However, in order to improve the precision of the measuring, it is preferable to use a model as simple as possible to fit to the impedance locus. That is, it is preferable to determine that an element (circuit) that does not affect the impedance locus is unnecessary.

Additionally, the shapes of an impedance locus after being fitted may seem to match even if a parameter having a large error or a meaningless parameter is present in the equivalent circuit model. Therefore, it is preferable not only to compare whether or not the shapes of an impedance locus match, but also to compare whether or not the measured value and the calculated value of impedance match at each frequency. This is because even if the shapes of an impedance locus are judged to be matching, a difference in phase of the impedance may appear when one of the above parameters is present. More specifically, whether or not measured values (measured data) and calculated values (calculation results) match can be determined by displaying the measured values and calculated values as impedance loci with dots in a display screen.

If the degree of matching between the measured values and calculated values does not seem good, whether or not it is necessary to modify the equivalent circuit model is determined (step S23). If the modification of the equivalent circuit model is unnecessary, parameter values are reset after returning to step S17. If the modification of the equivalent circuit model is necessary, the equivalent circuit model is modified (step S24) to start production of an equivalent circuit model (step S12) again.

If the shapes of locuses are judged to be matching, an error of each parameter is, for example, within about several percent, there is no parameter showing meaningless values, and characteristics of measured values and calculated values are judged to be matching (step S25).

Calculations are repeated in this manner by using an analysis program and adjusting the value of each parameter so that Cole-Cole plots or Bode diagrams obtained from measured values and calculated values match. At this point, if the value of a parameter changes very little, the parameter may be fixed. There is more than one combination of parameters that makes the shapes of Cole-Cole plots or Bode diagrams match. It is preferable to make many calculations by referring to the magnitude of errors between measured values and calculated values before determining values deemed appropriate. Each parameter is preferably fitted by using all points of measurement including frequency regions where an inductance component is visible.

Further connecting a parallel connected body 28 consisting of a resistance R1 and a capacitor C1 (hereinafter, referred to as an "RC parallel circuit 28"), as shown, for example, in FIG. 6A, can be considered as a modification method of the equivalent circuit model. The RC parallel circuit 28 is intended to model a film generated due to degradation of a battery or a film provided to stabilize the battery, and fitting to measured data can be made easier by adding the RC parallel circuit 28.

The number of the connected RC parallel circuits 28 can suitably be increased in accordance with the magnitude of errors between measured values and calculated values and the like. For example, an equivalent circuit model shown in FIG. 6B is a circuit in which the three RC parallel circuits 28 of an RC parallel circuit 28a consisting of the resistance R1 and the capacitor C1, an RC parallel circuit 28b consisting of a resistance R2 and a capacitor C2, and an RC parallel circuit 28c consisting of a resistance R3 and a capacitor C3 are connected in series. However, if the number of the connected RC parallel circuits 28 increases, measured values and calculated values tend to match more closely, but the number of elements having meaningless parameter values increases and thus, the number of the connected RC parallel circuits 28 is preferably smaller.

According to the experience of the inventors, if the battery is new or has been used only for a short time, approximately matching results between measured values and calculated values are obtained without using the RC parallel circuit 28.

If a matching result between measured values and calculated values is obtained, measured values of the lithium ion battery to be analyzed are judged to be representable by the equivalent circuit model (step S26), and each parameter of the lithium ion battery to be analyzed is determined (step S27).

FIG. 7 to FIG. 12 show measured data of internal impedance measured by the AC impedance method and calculated data of internal impedance using the value of each parameter after being fitted using the equivalent circuit model in FIG. 3 as complex plane diagrams (Cole-Cole plots) of six lithium ion batteries of different manufacturers and models (each represented in figures as "Battery A," "Battery B," "Battery C," "Battery D," "Battery E," and "Battery F"). Table 1 summarizes the values of parameters used for calculating the internal impedance.

TABLE 1

| | | Battery A | Battery B | Battery C | Battery D | Battery E | Battery F |
|---|---|---|---|---|---|---|---|
| $L_O$ | | 1.20E−06 | 8.88E−07 | 8.40E−07 | 9.74E−07 | 7.35E−07 | 6.20E−07 |
| $R_O$ | | 0.52765 | 0.45 | 0.42 | 0.43 | 0.3449 | 0.3 |
| $R_S$ | | 0.051512 | 0.053656 | 0.054911 | 0.054607 | 0.050733 | 0.042502 |
| $R_{ct}(+)$ | | 0.006262 | 0.007665 | 0.005922 | 0.005817 | 0.016132 | 0.009398 |
| $C_{dl}(+)$ | | 0.50857 | 0.15984 | 0.17221 | 0.24336 | 0.10003 | 0.099215 |
| W(+) | R | 0.012028 | 0.023524 | 0.023449 | 0.019656 | 0.031272 | 0.032567 |
| | T | 0.18268 | 0.20463 | 0.25593 | 0.23865 | 0.055454 | 0.044637 |
| | P | 0.45938 | 0.36663 | 0.3586 | 0.36895 | 0.39283 | 0.35495 |
| $R_{ct}(-)$ | | 0.005907 | 0.007959 | 0.006722 | 0.005861 | 0.007338 | 0.0062 |
| $C_{dl}(-)$ | | 0.89175 | 0.033433 | 0.036632 | 0.05384 | 0.044185 | 0.05147 |
| W(−) | R | 0.043715 | 0.090558 | 0.084009 | 0.086176 | 0.067591 | 0.070031 |
| | T | 60 | 160 | 155 | 164 | 160 | 160 |
| | P | 0.57386 | 0.68122 | 0.69676 | 0.69201 | 0.65496 | 0.66263 |

As FIG. 7 to FIG. 12 show, in all types of lithium ion batteries, calculated data of the internal impedance using the value of each parameter after being fitted using the equivalent circuit model in FIG. 3 closely matches measured data of the internal impedance measured by the AC impedance method. That is, the equivalent circuit model in FIG. 3 is extremely effective in representing the internal impedance of a lithium ion battery.

Next, among determined parameters, the parameters for comparing characteristics of lithium ion batteries are extracted (step S28) to make an assessment of the lithium ion batteries.

In the measuring method of lithium ion batteries according to the present embodiment, among determined parameters, the charge transfer resistance Rct (+) and the charge transfer resistance Rct (−) are of particular note. The charge transfer resistance Rct is a kinetic parameter representing how easily charges move, that is, how easily a reaction occurs on the surface of an electrode. A large value of the charge transfer resistance Rct means that it is difficult to occlude and discharge lithium ions. Conversely, a small value of the charge transfer resistance Rct means that it is easy to occlude and discharge lithium ions.

The magnitude of charge transfer resistance Rct (+) of the positive electrode 30 and that of the charge transfer resistance Rct (−) of the negative electrode 34 will be compared. If the charge transfer resistance Rct (+) of the positive electrode 30 is larger than the charge transfer resistance Rct (−) of the negative electrode 34, it is considered that 1) the positive electrode 30 is less likely to discharge lithium ions and the negative electrode 34 is more likely to occlude lithium ions during charging, and 2) the positive electrode 30 is less likely to occlude lithium ions and the negative electrode 34 is more likely to discharge lithium ions during discharging.

Conversely, if the charge transfer resistance Rct (−) of the negative electrode 34 is larger than the charge transfer resistance Rct (+) of the positive electrode 30, it is considered that 3) the positive electrode 30 is more likely to discharge lithium ions and the negative electrode 34 is less likely to occlude lithium ions during charging, and 4) the positive electrode 30 is more likely to occlude lithium ions and the negative electrode 34 is less likely to discharge lithium ions during discharging.

Some film such as deposited lithium or lithium compound or a dendrite thereof is considered to be formed in the cases of 2) and 3). According to results of analyzing impedance of degraded lithium ion batteries by the inventors, the impedance of the negative electrode significantly changed. Thus, the case of 3), in which a film is formed on the surface of the negative electrode, is considered to affect characteristics of the lithium ion battery the most.

From the foregoing, characteristics of charging and discharging of a lithium ion battery can be evaluated by analyzing the charge transfer resistance Rct (+) and the charge transfer resistance Rct (−). If, as a result of analyzing the charge transfer resistance Rct (+) and the charge transfer resistance Rct (−), the charge transfer resistance Rct (−) of the negative electrode 34 is larger than the charge transfer resistance Rct (+) of the positive electrode 30, it is considered that the lithium ion battery is more likely to have lithium or lithium compound or a dendrite generated on the negative electrode due to an effect of case 3). If there is an unnecessary deposit or dendrite inside the lithium ion battery, there is a possibility that the separator 32 for insulating the positive electrode 30 and the negative electrode 34 may be damaged while the battery is used, or an unexpected large current may be triggered, leading to defects such as smoking or firing.

According to investigations by the inventors, a lithium ion battery in which the charge transfer resistance Rct (−) of the negative electrode 34 is larger than the charge transfer resistance Rct (+) of the positive electrode 30 does not necessarily lead to defects such as smoking or firing. However, as described above, such a lithium ion battery still has properties that allow for the deposition of lithium or lithium compounds, or the generation of dendrites on the negative electrode. Comparing the magnitude of the charge transfer resistance Rct (+) of the positive electrode 30 and that of the charge transfer resistance Rct (−) of the negative electrode 34 provides an indicator of judging long-term reliability and safety of a lithium ion battery.

It is also possible to determine the quality of a lithium ion battery from analysis results of the charge transfer resistance Rct (+) and the charge transfer resistance Rct (−). For example, it is possible to provide criteria by which a lithium ion battery is judged to be good if the charge transfer resistance Rct (−) of the negative electrode 34 is smaller than the charge transfer resistance Rct (+) of the positive electrode 30.

FIGS. 13A and 13B to FIGS. 18A and 18B show graphs comparing the charge transfer resistance Rct (+) of the positive electrode 30 and the charge transfer resistance Rct (−) of the negative electrode 34 of six lithium ion batteries of different manufacturers and models (each represented in figures as "Battery A," "Battery B," "Battery C," "Battery D," "Battery E," and "Battery F"). "Battery A," "Battery B," "Battery C," "Battery D," "Battery E," and "Battery F" in FIGS. 13A and 13B to FIGS. 18A and 18B correspond to "Battery A," "Battery B," "Battery C," "Battery D," "Battery E," and "Battery F" in FIG. 7 to FIG. 12 respectively.

FIG. 13A, FIG. 14A, FIG. 15A, FIG. 16A, FIG. 17A, and FIG. 18A show results of measuring a plurality of unused batteries of the same type, and FIG. 13B, FIG. 14B, FIG. 15B, FIG. 16B, FIG. 17B, and FIG. 18B show results of measuring a plurality of batteries of the same type in different used states. The meanings of terms used in FIG. 13B, FIG. 14B, FIG. 15B, FIG. 16B, FIG. 17B, and FIG. 18B, are explained below:

"DOD=0%" means a battery whose depth of discharge (DOD) is 0% (fully charged).

"DOD=20%" means a battery whose depth of discharge is 20%.

"DOD=40%" means a battery whose depth of discharge is 40%.

"DOD=60%" means a battery whose depth of discharge is 60%.

"DOD=80%" means a battery whose depth of discharge is 80%.

"DOD=100%" means a battery whose depth of discharge is 100%.

"500 h" means a battery that has been left at 60° C. for 500 hours after being charged.

"500 h-discharge" means a battery that had been left at 60° C. for 500 hours after being charged and has been further charged and discharged.

"500 times" means a battery after undergoing the cycle of charging and discharging 500 times.

"500 times-discharge" means a battery that had undergone the cycle of charging and discharging 500 times and has been further charged and discharged.

Figure 13A:
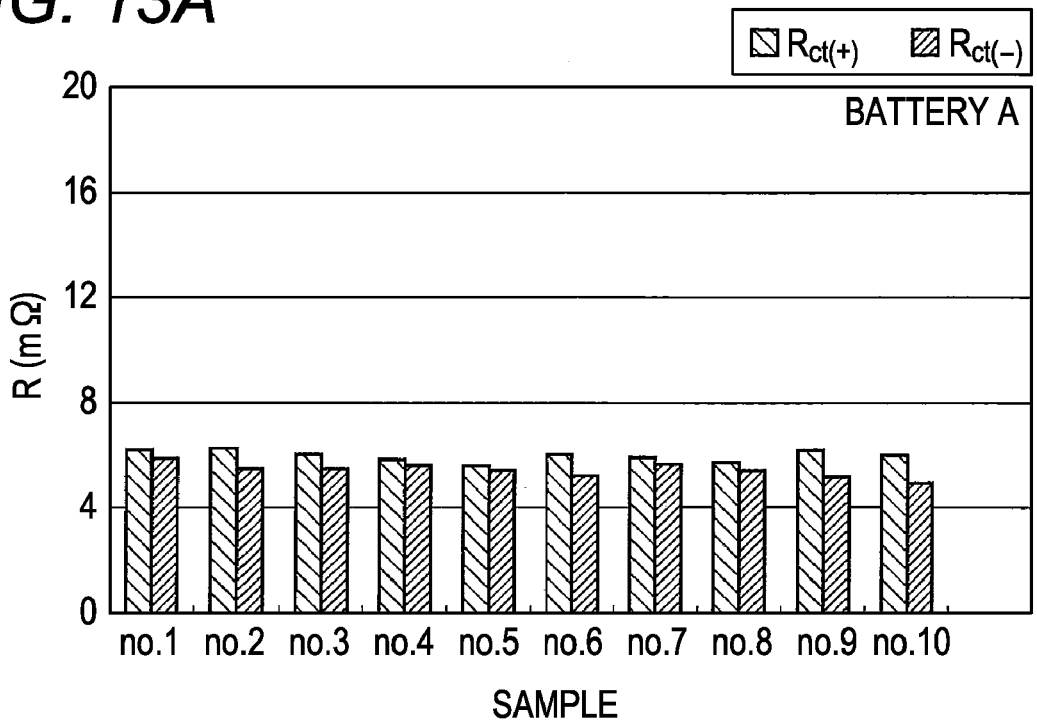
FIGS. 13A and 13B are graphs (part 1) comparing charge transfer resistance of a positive electrode of the lithium ion battery and that of a negative electrode of the lithium ion battery.
Figure 13B:
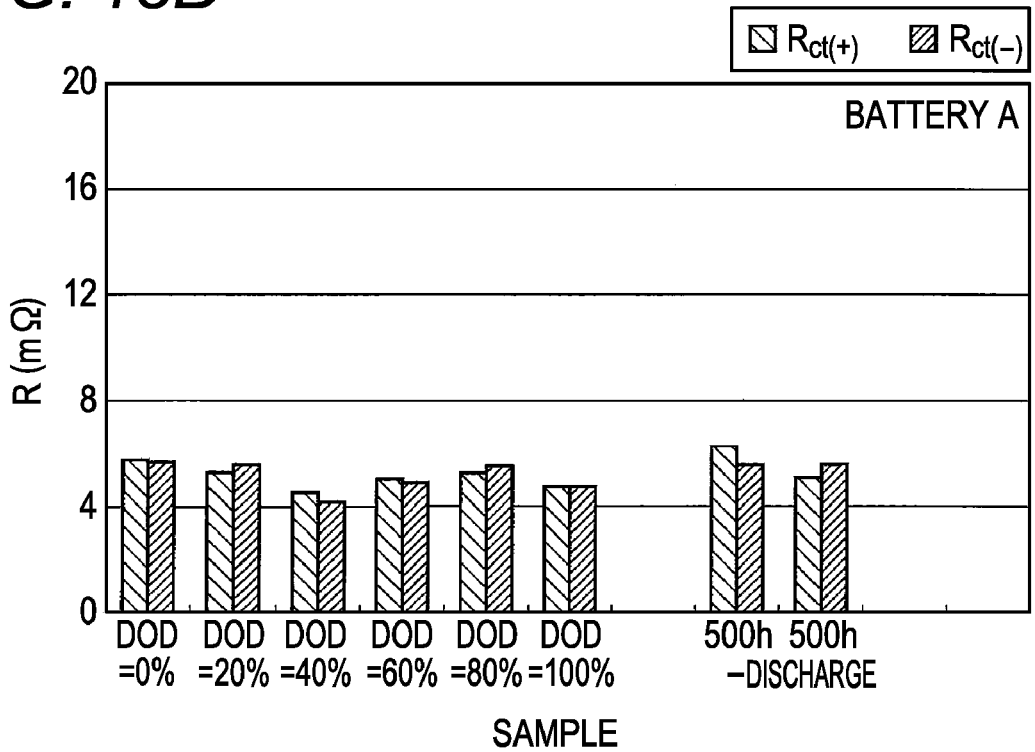
Figure 14A:
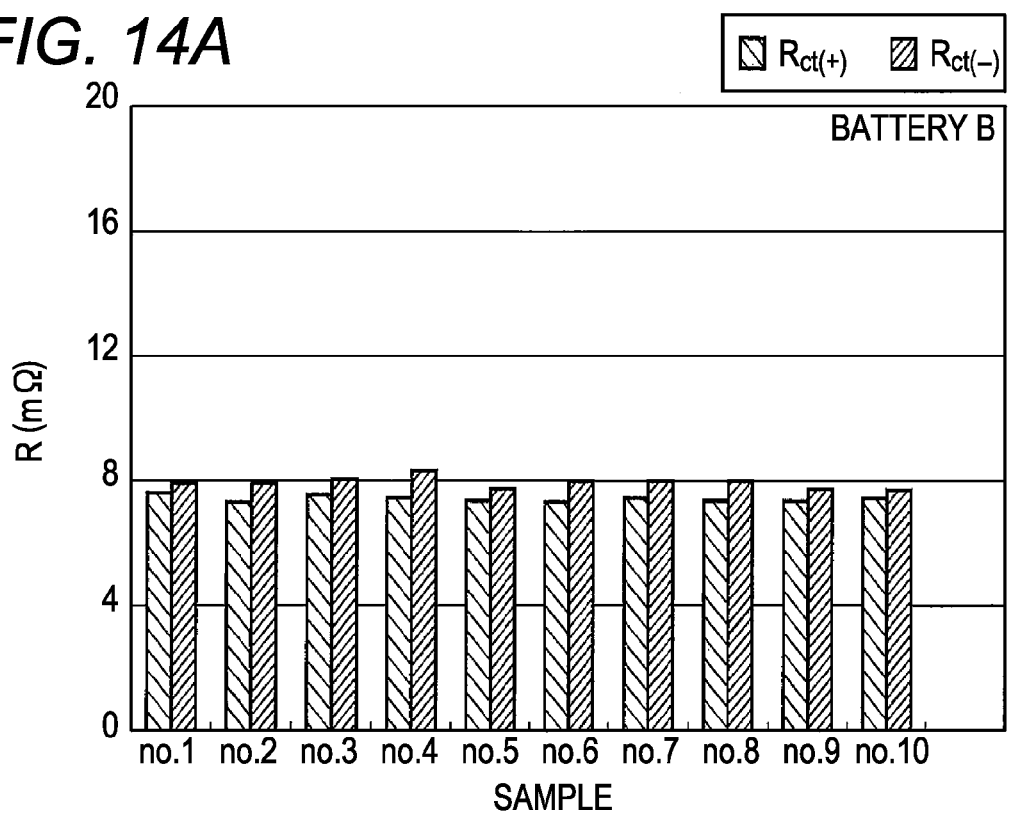
FIGS. 14A and 14B are graphs (part 2) comparing the charge transfer resistance of the positive electrode of the lithium ion battery and that of the negative electrode of the lithium ion battery.
Figure 14B:
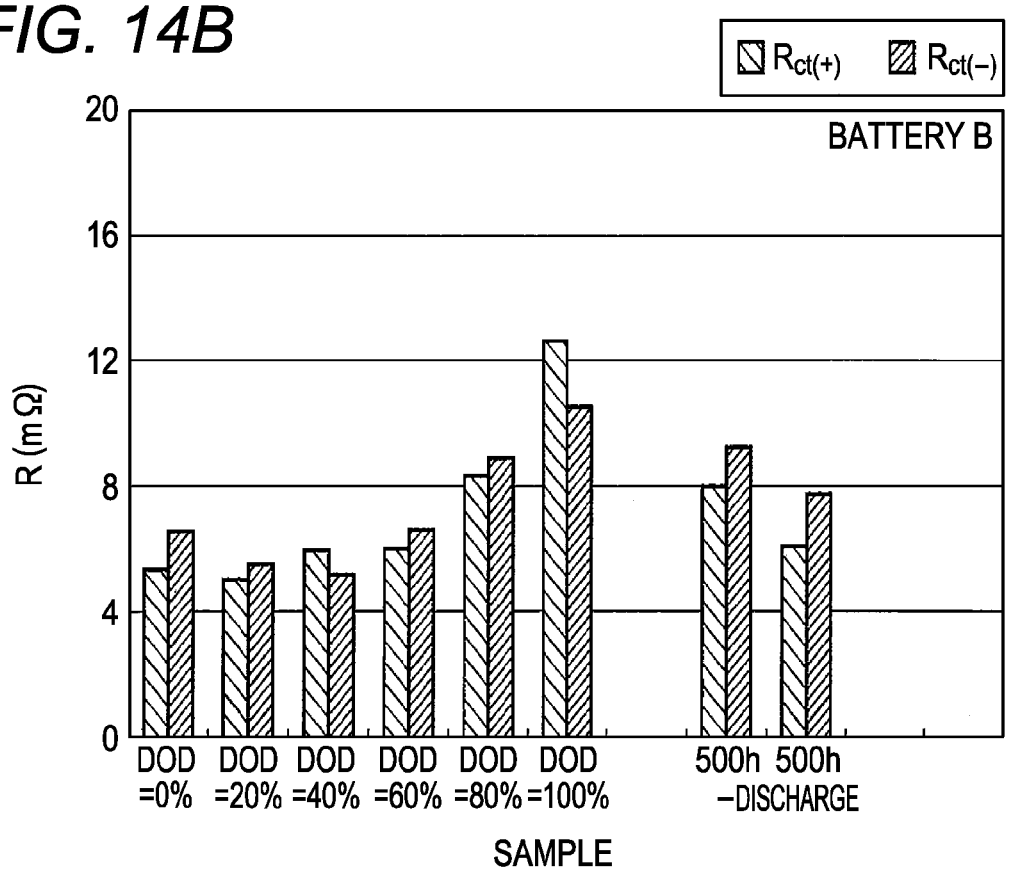
Figure 15A:
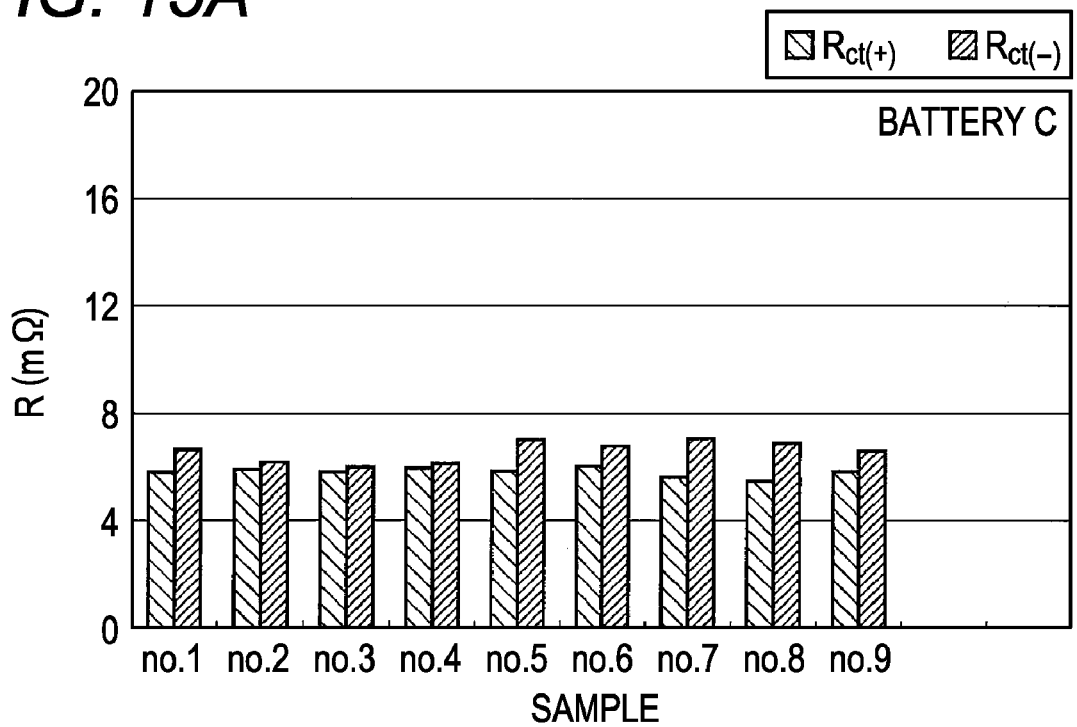
FIGS. 15A and 15B are graphs (part 3) comparing the charge transfer resistance of the positive electrode of the lithium ion battery and that of the negative electrode of the lithium ion battery.
Figure 15B:
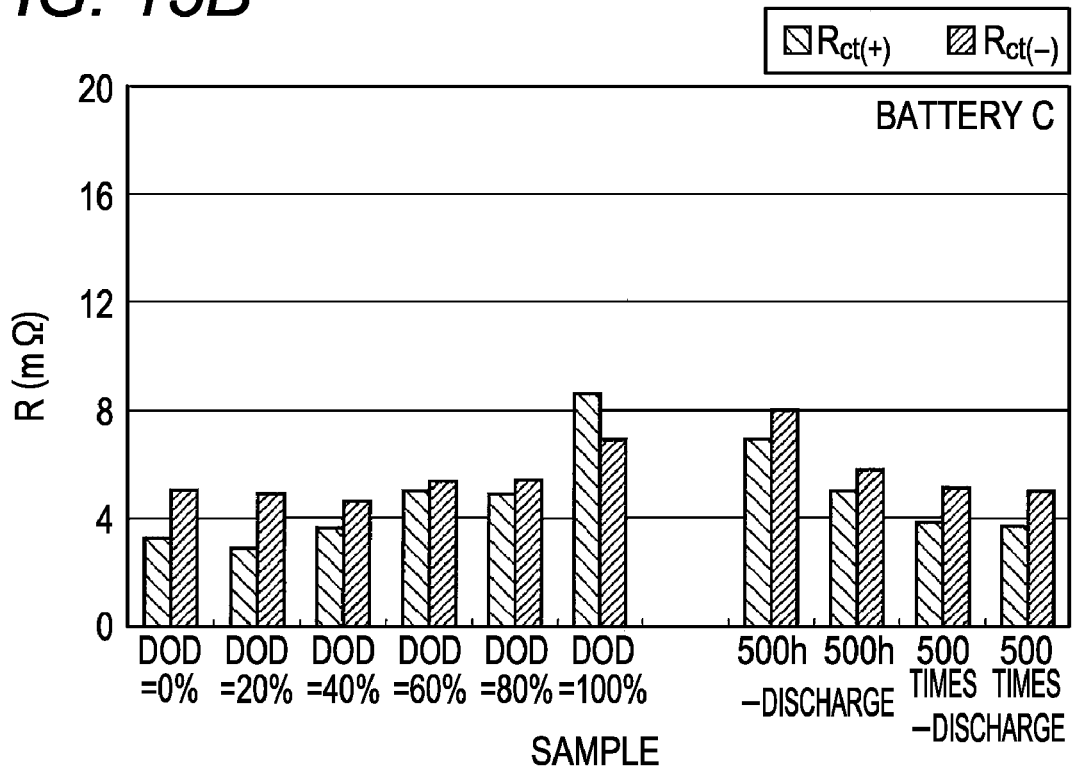
Figure 16A:
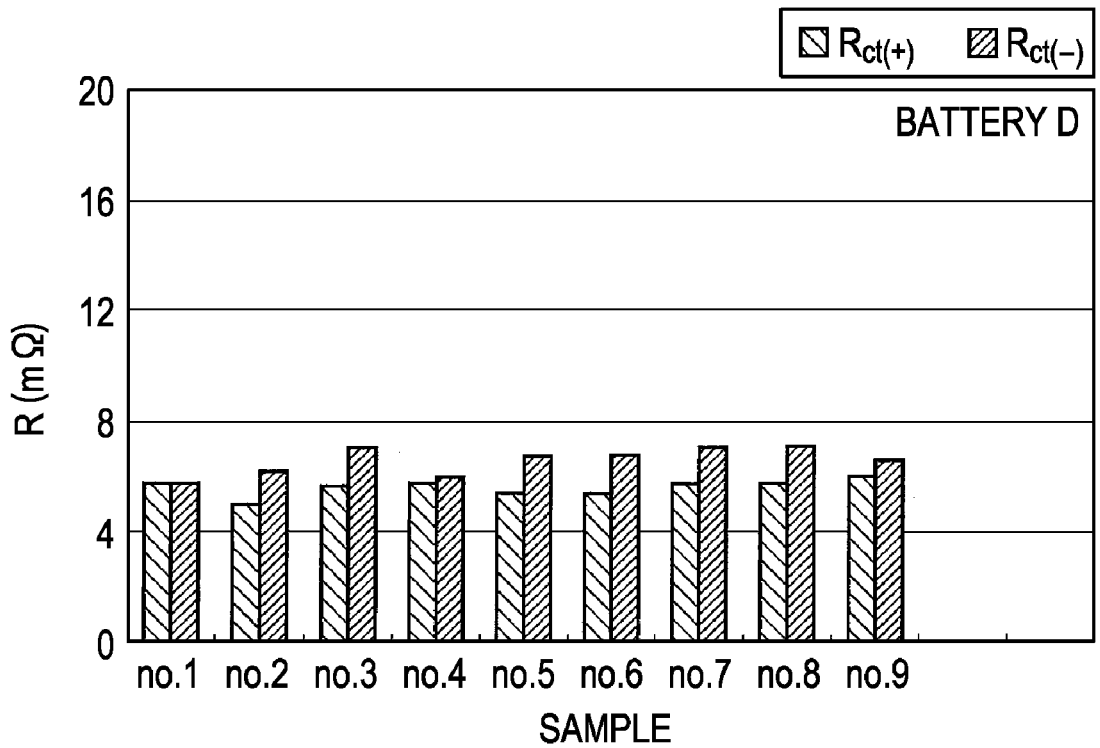
FIGS. 16A and 16B are graphs (part 4) comparing the charge transfer resistance of the positive electrode of the lithium ion battery and that of the negative electrode of the lithium ion battery.
Figure 16B:
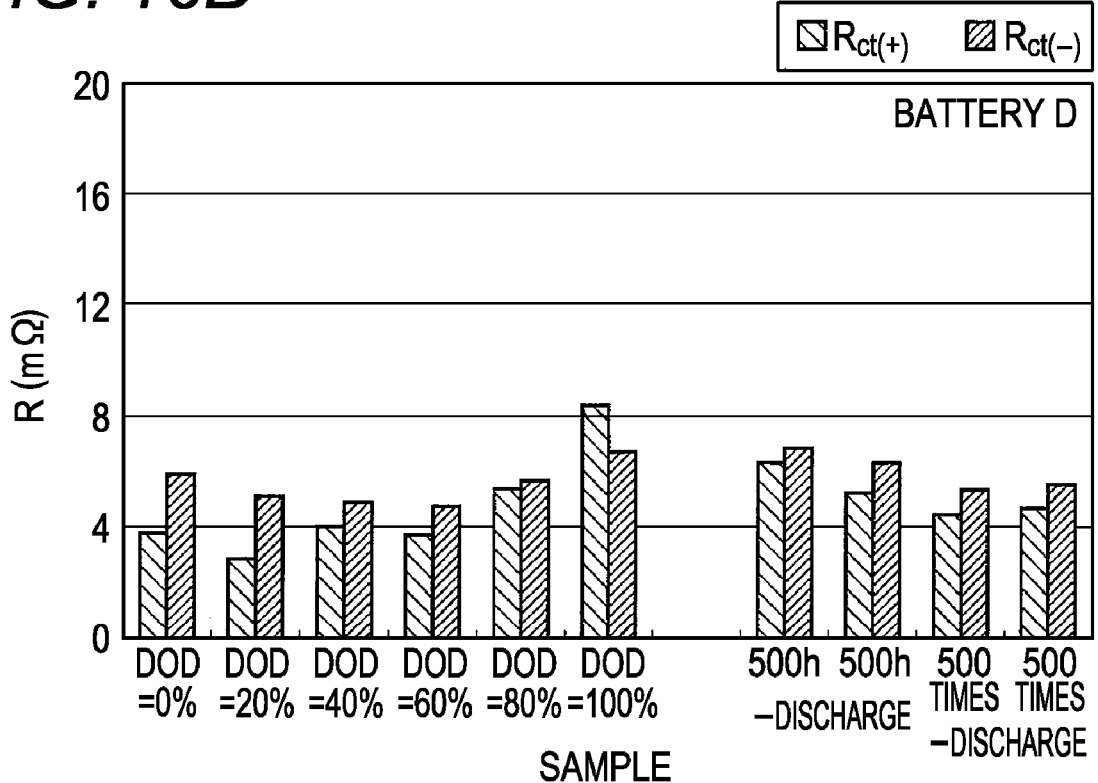

In Battery A, as shown in FIGS. 13A and 13B, a result in which the charge transfer resistance Rct (+) of the positive electrode 30 is larger than the charge transfer resistance Rct (−) of the negative electrode 34 is obtained in an unused state and a fully charged state. However, the difference in size relation between the charge transfer resistance Rct (+) of the positive electrode 30 and the charge transfer resistance Rct (−) of the negative electrode 34 is small and the size relation is sometimes reversed depending on the used state.

In Battery B to Battery D, as shown in FIGS. 14A and 14B to FIGS. 16A and 16B, a result in which the charge transfer resistance Rct (−) of the negative electrode 34 is larger than the charge transfer resistance Rct (+) of the positive electrode 30 is obtained in an unused state and a fully charged state. However, the difference in size relation between the charge transfer resistance Rct (+) of the positive electrode 30 and the charge transfer resistance Rct (−) of the negative electrode 34 is small and the size relation is sometimes reversed depending on the used state.

From the foregoing, Battery A to Battery D can be predicted to be used in circumstances in which the balance of resistance between two electrodes always changes depending on the charged capacity and the used state.

Figure 17A:
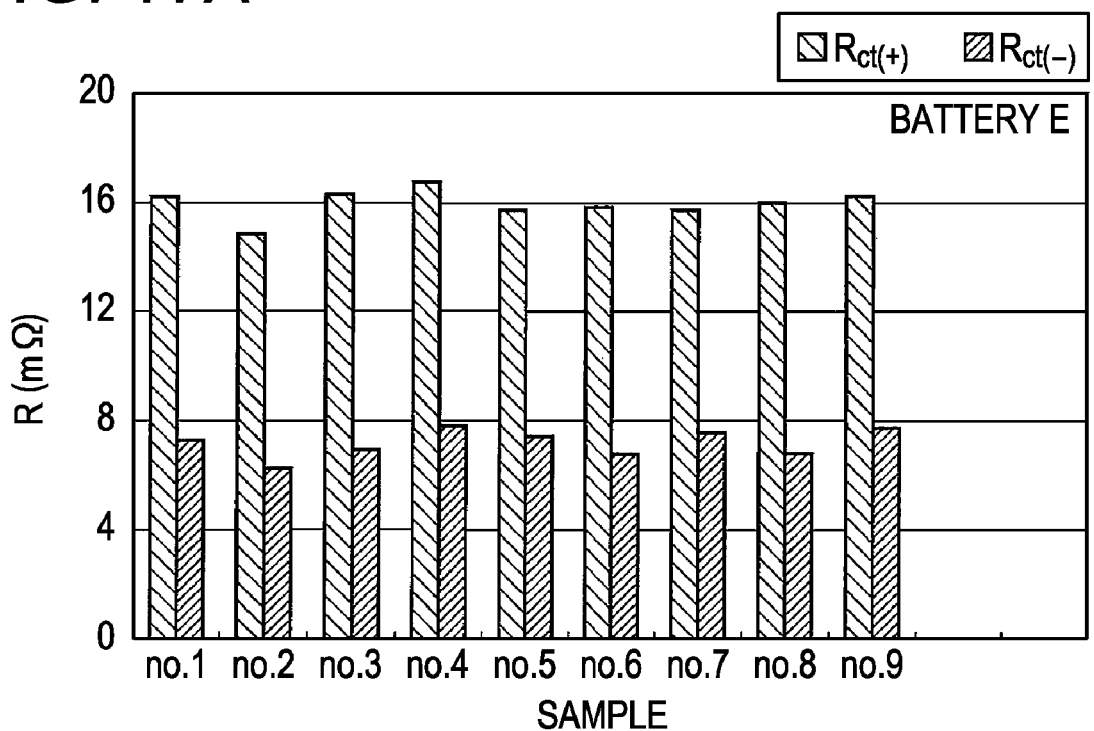
FIGS. 17A and 17B are graphs (part 5) comparing the charge transfer resistance of the positive electrode of the lithium ion battery and that of the negative electrode of the lithium ion battery.
Figure 17B:
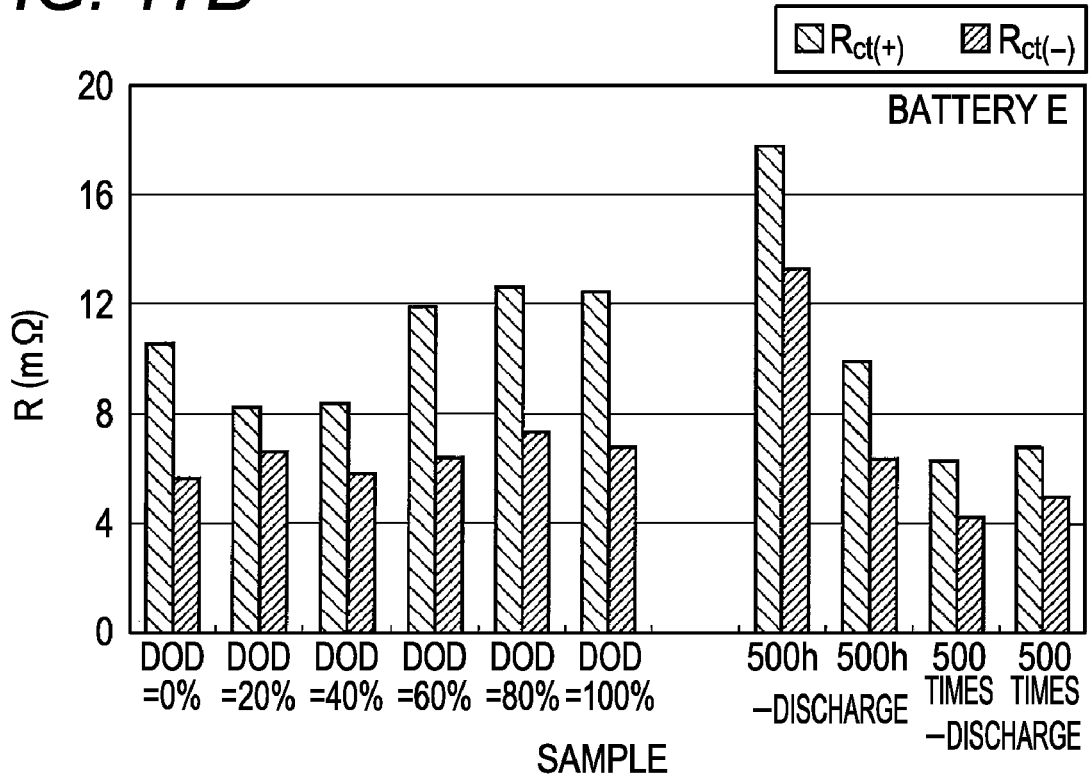

In Battery E, as shown in FIGS. 17A and 17B, a result in which the charge transfer resistance Rct (+) of the positive electrode 30 is always larger than the charge transfer resistance Rct (−) of the negative electrode 34 is obtained regardless of a used state and a charged state of a battery. Reversal of the size relation between the charge transfer resistance Rct (+) of the positive electrode 30 and the charge transfer resistance Rct (−) of the negative electrode 34, like Battery A to battery D, never occurred. The series resistance, charge transfer resistance Rct (+), and charge transfer resistance Rct (−) hardly changed in magnitude regardless of the charged capacity and the used state. Battery E can be predicted to be used in circumstances in which the balance of resistance between two electrodes does not change.

Figure 18A:
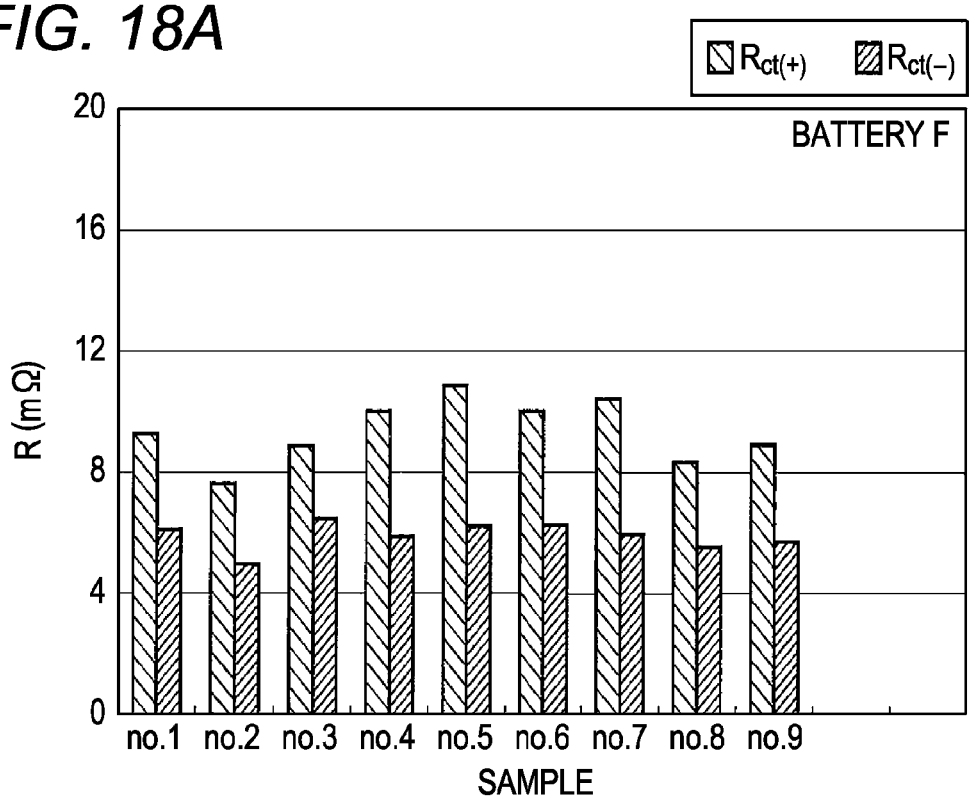
FIGS. 18A and 18B are graphs (part 6) comparing the charge transfer resistance of the positive electrode of the lithium ion battery and that of the negative electrode of the lithium ion battery.
Figure 18B:
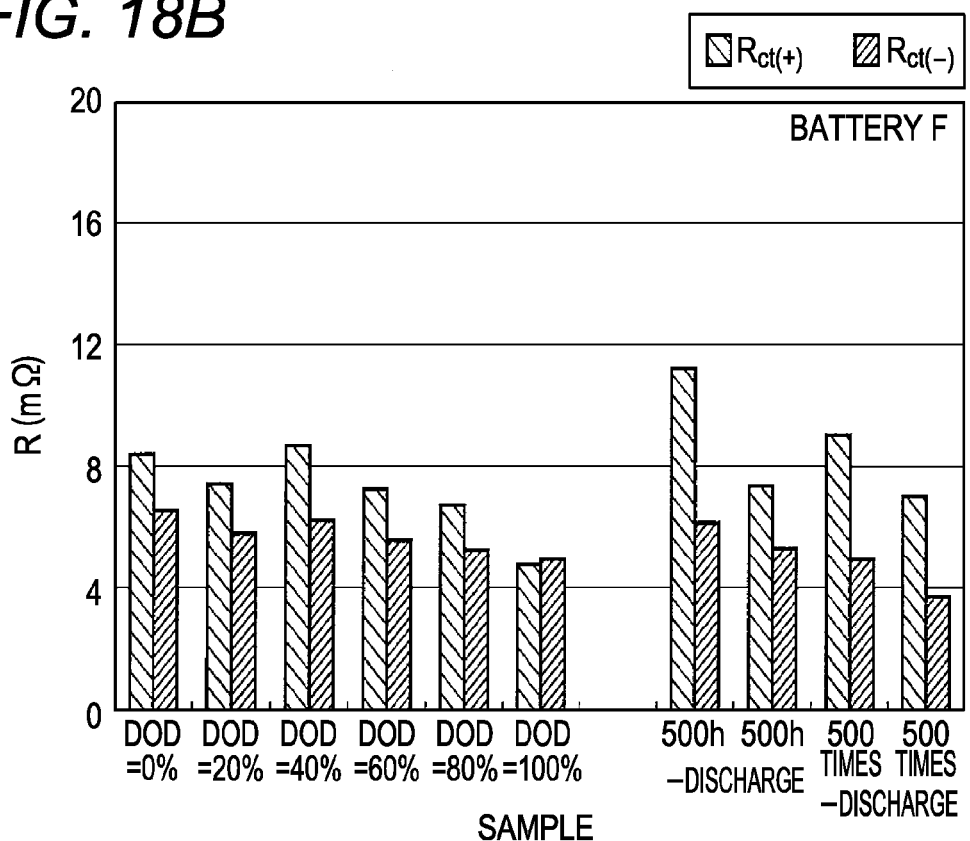

In Battery F, as shown in FIGS. 18A and 18B, a result like Battery E, in which the charge transfer resistance Rct (+) of the positive electrode 30 is always larger than the charge transfer resistance Rct (−) of the negative electrode 34, is obtained regardless of a used state and a charged state of a battery. Battery F can be predicted to be used in circumstances in which the balance of resistance between two electrodes does not change.

Examination of Battery A to Battery F from the viewpoint of charge transfer resistance based on the above measurement results shows a possibility of segregation of lithium (or lithium compounds) on the surface of the negative electrode of the battery, or shows that there is a possibility of a dendrite being generated for Battery A to Battery D, and segregation or a dendrite is less likely to be generated for Battery E and Battery F.

The resistance Rs is another effective parameter for distinguishing good lithium ion batteries from bad ones. A lithium ion battery whose resistance Rs is large is empirically known to be in an advanced state of degradation.

Therefore, by adding an evaluation based on the resistance Rs to that based on the charge transfer resistance Rct, the quality of a lithium ion battery can be determined more precisely.

Next, the process returns to step S11 to analyze another lithium ion battery or terminates if no more batteries are to be analyzed (step S29).

Since lithium ion batteries of the same type are considered to have normally the same characteristics, the value of each parameter determined at step S26 is considered to be usable as an initial value when another battery of the same type is analyzed. If the above operation is performed repeatedly and a lithium ion battery is present from which a parameter showing a clearly different tendency is obtained, the lithium ion battery can be judged to be defective.

Moreover, by analyzing batteries of different types and comparing parameters, characteristics of each battery can be known.

According to the present embodiment, as described above, frequency characteristics of an internal impedance of a lithium ion battery are measured by the AC impedance method. Also, optimal values of parameters of elements constituting an impedance model are determined so that calculation results of frequency characteristics of impedance using the impedance model having a circuit representing an electrochemical impedance of a positive electrode of the lithium ion battery and a circuit representing an electrochemical impedance of a negative electrode of the lithium ion battery match measurement results of frequency characteristics of an internal impedance. Therefore, measured data of the internal impedance of the lithium ion battery can be fitted precisely to the impedance model.

Moreover, by setting an initial value given to a parameter of an element related to lithium ion diffusion in a negative electrode that is larger than an initial value given to a parameter of an element related to lithium ion diffusion in a positive electrode when determining optimal values of parameters, measured data of the internal impedance of the lithium ion battery can be fitted easily to the impedance model.

Also, by comparing the size relation of a parameter of an element representing ease of mobility of charges on the surface of the positive electrode and that of an element representing ease of mobility of charges on the surface of the negative electrode, characteristics such as charging/discharging characteristics, long-term reliability, and safety of a lithium ion battery can be evaluated.

Also, by applying the above measuring method to a characteristic evaluation process in the manufacture of lithium ion batteries, highly reliable lithium ion batteries can be manufactured.

[Modification of the First Embodiment]

The present invention is not limited to the above embodiment and can be modified in various ways.

In the above embodiment, for example, equivalent circuits shown by the circuits 24 and 26 in FIG. 3 are used as equivalent circuits describing an electrochemical impedance of electrodes, but equivalent circuits describing an electrochemical impedance of electrodes are not limited to these.

Figure 6A:
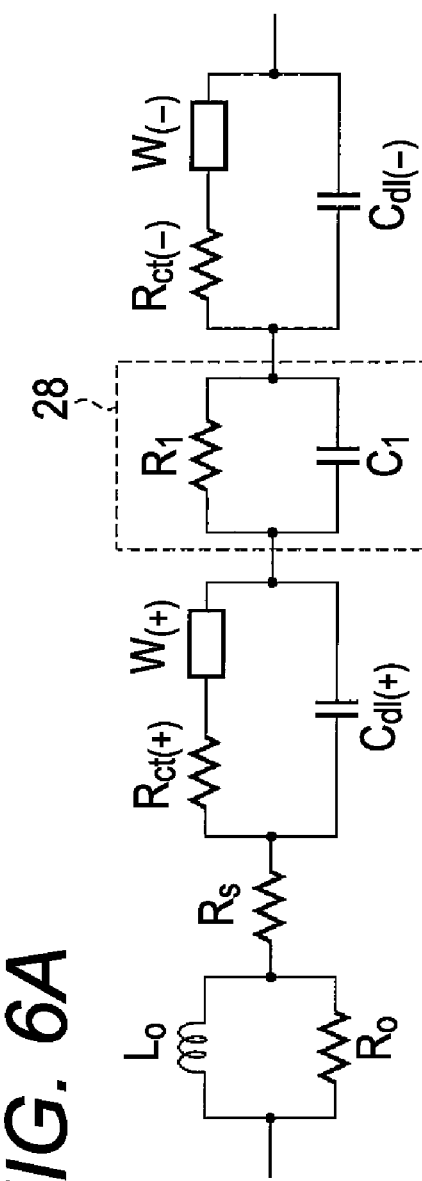
FIGS. 6A and 6B are circuit diagrams showing other examples of the equivalent circuit model of the lithium ion battery used for the measuring method of the lithium ion battery according to the first embodiment.
Figure 6B:
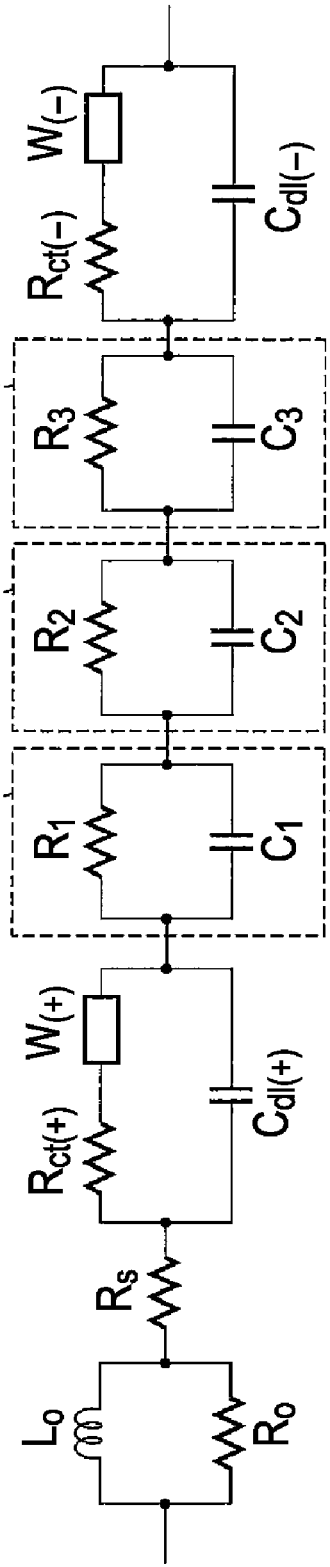
Figure 8:
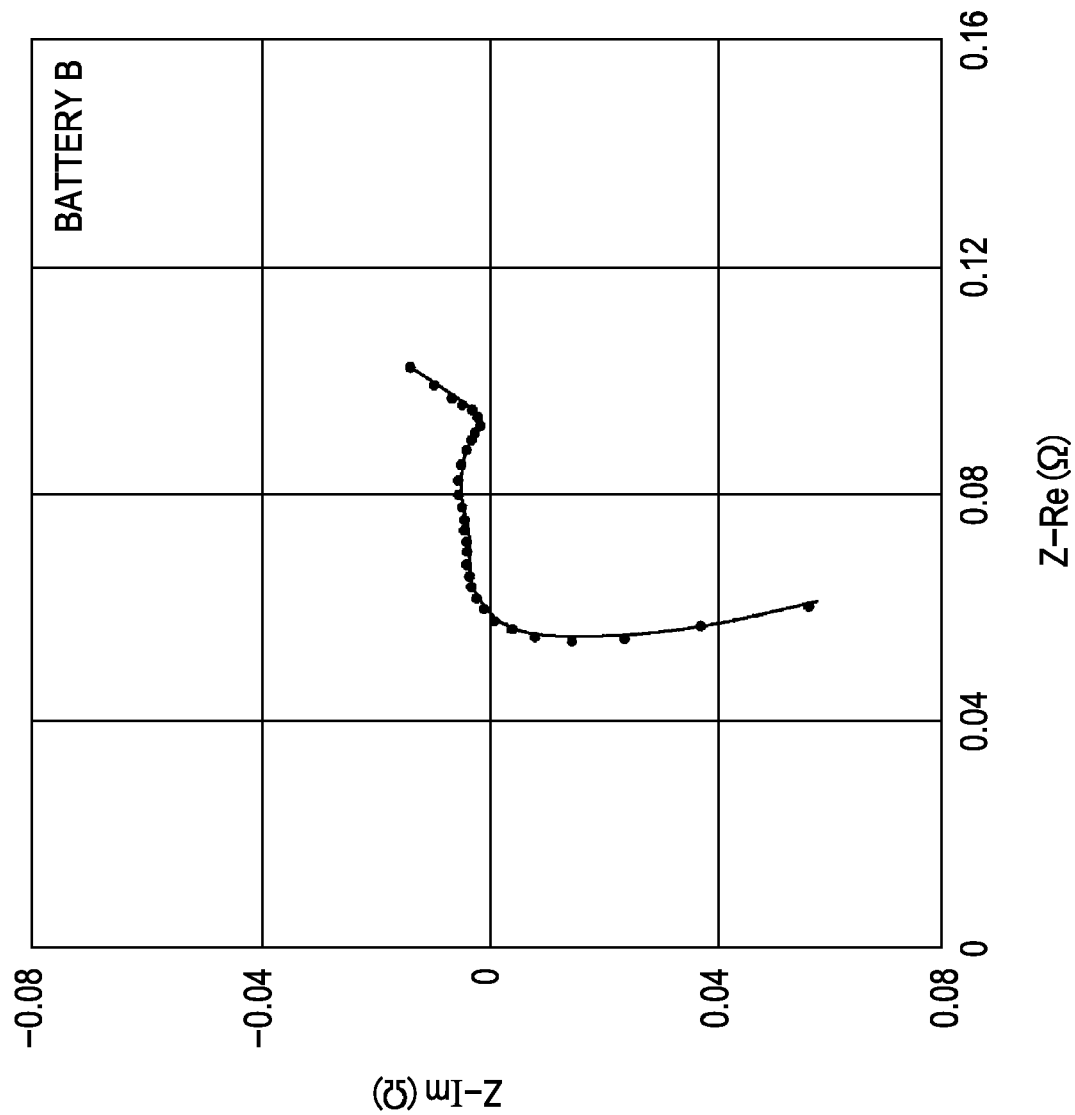
FIG. 8 is a graph (part 2) representing measured data and calculated data of the internal impedance of the lithium ion battery as a complex plane diagram.

Also, the overall configuration of an equivalent circuit model is not limited to the equivalent circuits shown in FIG. 3 or FIGS. 6A and 6B.

What is claimed is:

1. A measuring method of a battery, comprising:
measuring frequency characteristics of an internal impedance of the battery by an AC impedance method using a measuring apparatus;
determining, by a computer, frequency characteristics of an impedance using an impedance model of the battery;
determining, by the computer, parameters of elements constituting the impedance model so that calculation results of frequency characteristics of the impedance match measured results of frequency characteristics of the internal impedance; and
determining from the parameters, by the computer, a parameter of an element representing an ease of mobility of charges on a surface of a positive electrode of the battery and that of an element representing the ease of mobility of charges on the surface of a negative electrode,
wherein the battery is a lithium ion battery,
characteristics of the lithium ion battery are measured by the computer by comparing a size relation between the parameter of the element representing the ease of mobility of charges on the surface of the positive electrode of the lithium ion battery and that of the element representing the ease of mobility of charges on the surface of the negative electrode of the lithium ion battery, and
an initial value to be given to a parameter of an element related to lithium ion diffusion in the negative electrode is set to be larger than that to be given to a parameter of an element related to lithium ion diffusion in the positive electrode when determining optimal values of the parameters.

2. The measuring method of a battery according to claim 1, wherein
the impedance model of the lithium ion battery comprises a first equivalent circuit representing an electrochemical impedance of the positive electrode of the lithium ion battery and a second equivalent circuit connected to the first equivalent circuit in series and representing the electrochemical impedance of the negative electrode of the lithium ion battery, the element representing the ease of mobility of charges on the surface of the positive electrode of the lithium ion battery is included in elements constituting the first equivalent circuit, and the element representing the ease of mobility of charges on the surface of the negative electrode of the lithium ion battery is included in elements constituting the second equivalent circuit.

3. The measuring method of a battery according to claim 1, wherein
the initial value is given to distinguish the positive electrode and the negative electrode.

4. The measuring method of a battery according to claim 2, wherein the first equivalent circuit has a first charge transfer resistance, a first diffusion impedance connected to the first charge transfer resistance in series and representing an impedance component related to diffusion of lithium ions into an electrolyte, and a first electric double layer capacitance connected in parallel to a serially connected body consisting of the first charge transfer resistance and the first diffusion impedance and representing a capacity at an interface of the positive electrode, and the element representing the ease of mobility of charges on the surface of the positive electrode is the first charge transfer resistance, and the second equivalent circuit has a second charge transfer resistance, a second diffusion impedance connected to the second charge transfer resistance in series and representing an impedance component related to the diffusion of lithium ions into the electrolyte, and a second electric double layer capacitance connected in parallel to the serially connected body consisting of the second charge transfer resistance and the second diffusion impedance and representing the capacity at the interface of the negative electrode, and the element representing the ease of mobility of charges on the surface of the negative electrode is the second charge transfer resistance.

5. The measuring method of a battery according to claim 2, wherein the impedance model further includes a third equivalent circuit connected in series and in which a parallel connected body consisting of a resistance representing an impedance component resulting from a structure of the lithium ion battery and an inductor, and a resistance representing a resistance component of a whole cell at high frequencies are connected in series.

6. The measuring method of a battery according to claim 5, wherein a degree of degradation of the lithium ion battery is evaluated from a value of the resistance representing the resistance component of the whole cell at high frequencies.

7. The measuring method of a battery according to claim 2, wherein the impedance model further includes at least one RC parallel circuit connected in series.

8. The measuring method of a battery according to claim 1, wherein the characteristics of the lithium ion battery are charging and discharging characteristics of the lithium ion battery.

9. The measuring method of a battery according to claim 1, wherein the characteristics of the lithium ion battery are long-term reliability and safety.

10. The measuring method of a battery according to claim 1, wherein the lithium ion battery in which the parameter of the element representing the ease of mobility of charges on the surface of the positive electrode is larger than that of the element representing the ease of mobility of charges on the surface of the negative electrode is judged to be good.

11. A method of manufacturing a battery, comprising:
measuring frequency characteristics of an internal impedance of the battery by an AC impedance method using a measuring apparatus;
determining, by a computer, frequency characteristics of an impedance using an impedance model of the battery;
determining, by the computer, parameters of elements constituting the impedance model so that calculation results of frequency characteristics of the impedance match measured results of frequency characteristics of the internal impedance; and
measuring characteristics of the battery by determining from the parameters, by the computer, a parameter of an element representing the ease of mobility of charges on a surface of a positive electrode of the battery and that of an element representing the ease of mobility of charges on the surface of a negative electrode,
wherein the battery is a lithium ion battery,
characteristics of the lithium ion battery are measured by the computer by comparing a size relation between the parameter of the element representing the ease of mobility of charges on the surface of the positive electrode of the lithium ion battery and that of the element representing the ease of mobility of charges on the surface of the negative electrode of the lithium ion battery, and
an initial value to be given to a parameter of an element related to lithium ion diffusion in the negative electrode is set to be larger than that to be given to a parameter of an element related to lithium ion diffusion in the positive electrode when determining optimal values of the parameters.

12. The method of manufacturing the battery according to claim 11, wherein the initial value is given to distinguish the positive electrode and the negative electrode.

* * * * *